(12) United States Patent
Koshizawa et al.

(10) Patent No.: US 12,334,358 B2
(45) Date of Patent: Jun. 17, 2025

(54) INTEGRATION PROCESSES UTILIZING BORON-DOPED SILICON MATERIALS

(71) Applicant: Applied Materials, Inc., Santa Clara, CA (US)

(72) Inventors: Takehito Koshizawa, San Jose, CA (US); Karthik Janakiraman, San Jose, CA (US); Rui Cheng, San Jose, CA (US); Krishna Nittala, San Jose, CA (US); Menghui Li, Mountain View, CA (US); Ming-Yuan Chuang, Boise, ID (US); Susumu Shinohara, Yokohama (JP); Juan Guo, San Jose, CA (US); Xiawan Yang, San Jose, CA (US); Russell Chin Yee Teo, Palo Alto, CA (US); Zihui Li, Santa Clara, CA (US); Chia-Ling Kao, San Jose, CA (US); Qu Jin, Santa Clara, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 764 days.

(21) Appl. No.: 17/378,720

(22) Filed: Jul. 18, 2021

(65) Prior Publication Data
US 2022/0020599 A1  Jan. 20, 2022

Related U.S. Application Data

(60) Provisional application No. 63/053,693, filed on Jul. 19, 2020.

(51) Int. Cl.
*H01L 21/311*  (2006.01)
*H01J 37/32*  (2006.01)
(Continued)

(52) U.S. Cl.
CPC .. *H01L 21/31116* (2013.01); *H01J 37/32146* (2013.01); *H01L 21/0332* (2013.01);
(Continued)

(58) Field of Classification Search
CPC .......... H01L 21/31116; H01L 21/0332; H01L 21/0337; H01L 21/31144; H01L 21/32137;
(Continued)

(56) References Cited

U.S. PATENT DOCUMENTS

| 9,390,923 B2 * | 7/2016 | Yoo ......................... H01L 21/32 |
| 2003/0162395 A1 * | 8/2003 | Trapp ................ H01L 21/31144 |
| | | 257/E21.252 |

(Continued)

FOREIGN PATENT DOCUMENTS

| JP | 08153688 A | 6/1996 |
| JP | 2007134668 A | 5/2007 |

(Continued)

OTHER PUBLICATIONS

International Search Report and Written Opinion mailed Nov. 5, 2021 in International Patent Application No. PCT/US2021/041518, 8 pages.

(Continued)

*Primary Examiner* — Ratisha Mehta
*Assistant Examiner* — Brad A Knudson
(74) *Attorney, Agent, or Firm* — Kilpatrick Townsend & Stockton LLP

(57) ABSTRACT

Exemplary processing methods may include depositing a boron-containing material or a silicon-and-boron-containing material on a substrate disposed within a processing region of a semiconductor processing chamber. The methods may include etching portions of the boron-containing material or the silicon-and-boron-containing material with a chlorine- (Continued)

containing precursor to form one or more features in the substrate. The methods may also include removing remaining portions of the boron-containing material or the silicon-and-boron-containing material from the substrate with a fluorine-containing precursor.

20 Claims, 8 Drawing Sheets

(51) Int. Cl.
  *H01L 21/033* (2006.01)
  *H01L 21/3213* (2006.01)
  *H01L 21/3205* (2006.01)
(52) U.S. Cl.
  CPC .... *H01L 21/0337* (2013.01); *H01L 21/31144* (2013.01); *H01L 21/32137* (2013.01); *H01J 37/32091* (2013.01); *H01J 2237/334* (2013.01); *H01L 21/32055* (2013.01)
(58) Field of Classification Search
  CPC .......... H01L 21/32055; H01J 37/32146; H01J 37/32091; H01J 2237/334
  See application file for complete search history.

(56) References Cited

U.S. PATENT DOCUMENTS

| | | | | |
|---|---|---|---|---|
| 2009/0315030 A1* | 12/2009 | Choi | ..................... | G06F 3/0412 257/53 |
| 2012/0080779 A1* | 4/2012 | Seamons | ............. | C23C 16/0272 257/E21.24 |
| 2014/0057442 A1* | 2/2014 | Lee | ......................... | H01L 28/90 257/618 |
| 2015/0064914 A1* | 3/2015 | Kong | .................. | H01L 21/6831 438/725 |
| 2015/0126035 A1* | 5/2015 | Diao | ..................... | H01J 37/321 438/710 |
| 2016/0086815 A1* | 3/2016 | Pandit | ............... | H01L 21/32139 438/703 |
| 2016/0225784 A1* | 8/2016 | Omura | ................ | H01L 21/0337 |
| 2016/0293441 A1* | 10/2016 | Lee | ......................... | H10B 43/50 |
| 2017/0125253 A1* | 5/2017 | Tan | ..................... | H01L 21/3065 |
| 2017/0287778 A1* | 10/2017 | Okada | ................... | C23C 16/045 |
| 2018/0005850 A1* | 1/2018 | Citla | ................. | H01L 21/31116 |
| 2018/0130669 A1* | 5/2018 | Lane | ................. | H01L 21/31144 |
| 2018/0174860 A1* | 6/2018 | Kanarik | ............ | H01L 21/30621 |
| 2018/0182597 A1 | 6/2018 | Blomberg et al. | | |
| 2018/0337047 A1 | 11/2018 | Fung et al. | | |
| 2018/0350596 A1* | 12/2018 | Gadre | ............... | H01L 21/02592 |
| 2019/0157093 A1* | 5/2019 | Sasahara | ............... | H01L 21/324 |
| 2019/0311915 A1 | 10/2019 | Nagatomo et al. | | |
| 2020/0176322 A1* | 6/2020 | Lin | ................... | H01L 21/31116 |
| 2020/0176323 A1* | 6/2020 | Lo | ..................... | H01L 29/66545 |
| 2022/0392772 A1* | 12/2022 | Liu | ................... | H01L 29/66227 |

FOREIGN PATENT DOCUMENTS

| | | |
|---|---|---|
| JP | 2017162851 A | 9/2017 |
| JP | 2018511166 A | 4/2018 |
| JP | 2020507922 A | 3/2020 |
| KR | 20030011200 A | 2/2003 |
| KR | 20140026086 A | 3/2014 |
| KR | 2016-0119329 A | 10/2016 |
| KR | 20170133372 A | 12/2017 |
| KR | 20180029925 A | 3/2018 |
| TW | I672740 B | 9/2019 |
| TW | I674628 B | 10/2019 |

OTHER PUBLICATIONS

Application No. PCT/US2021/041518 , International Preliminary Report on Patentability, Mailed On Feb. 2, 2023, 6 pages.

* cited by examiner

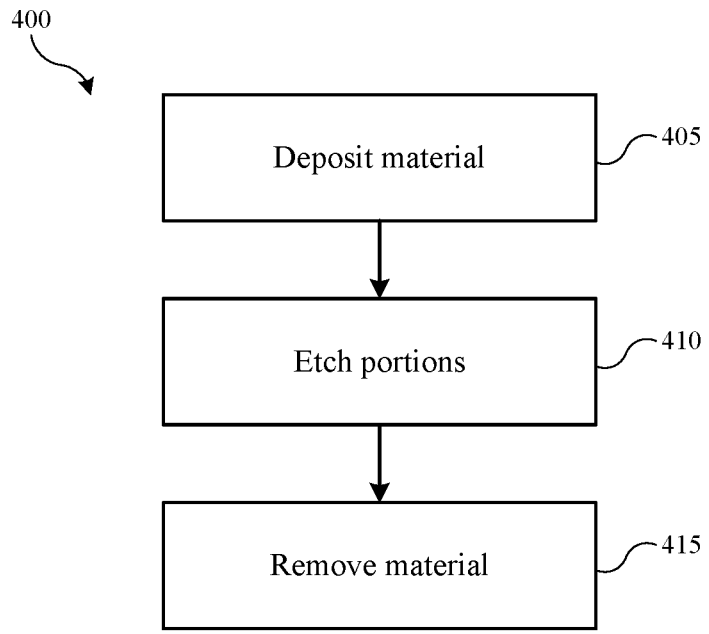
FIG. 4
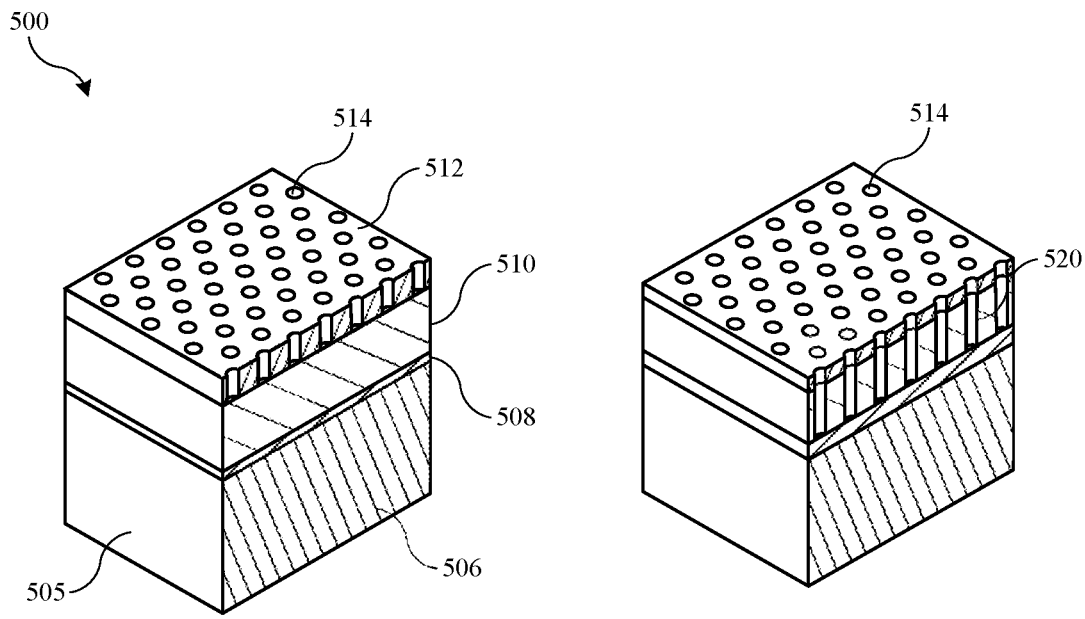
FIG. 5A  FIG. 5B

INTEGRATION PROCESSES UTILIZING BORON-DOPED SILICON MATERIALS

CROSS-REFERENCE TO RELATED APPLICATIONS

This application claims the benefit of, and priority to U.S. Provisional Application Ser. No. 63/053,693, filed Jul. 19, 2020, which is hereby incorporated by reference in its entirety for all purposes.

TECHNICAL FIELD

The present technology relates to semiconductor integration processes. More specifically, the present technology relates to methods of depositing, etching, and removing materials including boron or boron-and-silicon materials.

BACKGROUND

Integrated circuits are made possible by processes which produce intricately patterned material layers on substrate surfaces. Producing patterned material on a substrate requires controlled methods of formation and removal of exposed material. As device sizes continue to shrink, material uniformity may affect subsequent operations. For example, many processing operations utilize mask materials or sacrificial materials to facilitate pattern transfer or structural formation within or between layers of a semiconductor substrate. As the number of different materials used in processing increases, and as the critical dimensions of structural aspects reduces, utilizing masks with increased selectivity to the various exposed materials becomes more important.

Thus, there is a need for improved systems and methods that can be used to produce high quality devices and structures. These and other needs are addressed by the present technology.

SUMMARY

Exemplary processing methods may include depositing a boron-containing material or a silicon-and-boron-containing material on a substrate disposed within a processing region of a semiconductor processing chamber. The methods may include etching portions of the boron-containing material or the silicon-and-boron-containing material with a chlorine-containing precursor to form one or more features in the substrate. The methods may also include removing remaining portions of the boron-containing material or the silicon-and-boron-containing material from the substrate with a fluorine-containing precursor.

In some embodiments, the boron-containing material may be a silicon-and-boron-containing material. Depositing the boron-containing material may include delivering a silicon-containing precursor and a boron-containing precursor to a processing region of a semiconductor processing chamber. Depositing the boron-containing material may include providing a hydrogen-containing precursor with the silicon-containing precursor and the boron-containing precursor. A flow rate ratio of the hydrogen-containing precursor to either of the silicon-containing precursor or the boron-containing precursor may be greater than or about 2:1. Depositing the boron-containing material may include forming a plasma of all precursors within the processing region of a semiconductor processing chamber. The silicon-containing precursor may be or include silane, and the boron-containing precursor may be or include diborane. The removing may occur at a rate of greater than or about 35 nm/min, and the boron-containing material may be characterized by a film thickness greater than or about 20 nm.

A substrate temperature may be maintained above or about 400° C. during the depositing the boron-containing material on the substrate. The substrate temperature may be maintained above or about 200° C. during the removing. The etching may include forming a plasma of a bromine-containing precursor. The etching may include contacting the boron-containing material with plasma effluents of the bromine-containing precursor. The etching may include halting delivery of the bromine-containing precursor. The etching may include forming a plasma of a chlorine-containing precursor. The etching may include contacting the boron-containing material with plasma effluents of the chlorine-containing precursor. The etching may include forming a plasma of an etchant mixture comprising the chlorine-containing precursor and an oxygen-containing precursor. The etching may include contacting the boron-containing material with plasma effluents of the etchant mixture while forming the plasma at a first plasma power. The etching may include, subsequent a first period of time, increasing the first plasma power to a second plasma power. The etching may include transferring a pattern from an overlying mask material through the boron-containing material. The etching may include applying a bias power during the first period of time. The etching may include halting the bias power subsequent the first period of time. The removing may include forming a remote plasma of an etchant mixture comprising the fluorine-containing precursor and a hydrogen-containing precursor. The removing may include contacting the boron-containing material with plasma effluents of the etchant mixture. The removing may include removing the boron-containing material at a selectivity of greater than or about 20:1 relative to another exposed material on the substrate. The remote plasma may be formed at a plasma power of greater than or about 2.0 kW.

Some embodiments of the present technology may encompass processing methods. The methods may include depositing a silicon-and-boron-containing material on a substrate disposed within a processing region of a semiconductor processing chamber. The methods may include etching portions of the silicon-and-boron-containing material to form one or more features in the substrate. The etching may include forming a plasma of an etchant mixture including a chlorine-containing precursor and an oxygen-containing precursor. The etching may include contacting the silicon-and-boron-containing material with plasma effluents of the etchant mixture while forming the plasma at a first plasma power. The etching may include, subsequent a first period of time, increasing the first plasma power to a second plasma power. The methods may include removing remaining portions of the silicon-and-boron-containing material from the substrate with a fluorine-containing precursor.

In some embodiments, the silicon-and-boron-containing material may be characterized by a boron concentration of greater than or about 40 at. %. The etchant mixture may include a fluorine-containing precursor. A flow-rate ratio of the fluorine-containing precursor to the oxygen-containing precursor to the chlorine-containing precursor may be greater than or about 1:5:10. The methods may include applying a bias power during the first period of time. The methods may include halting the bias power subsequent the first period of time. The plasma may be formed at a pulsing frequency of greater than or about 500 Hz. A duty cycle of the bias power during the plasma formation may be less than or about 40%.

Some embodiments of the present technology may encompass processing methods. The methods may include depositing a silicon-and-boron-containing material on a substrate disposed within a processing region of a semiconductor processing chamber. The methods may include etching portions of the silicon-and-boron-containing material with a chlorine-containing precursor to form one or more features in the substrate. The methods may include removing remaining portions of the silicon-and-boron-containing material from the substrate. The removing may include forming a remote plasma of an etchant mixture including a fluorine-containing precursor and a hydrogen-containing precursor. The removing may include contacting the silicon-and-boron-containing material with plasma effluents of the etchant mixture. The methods may include removing the silicon-and-boron-containing material at a rate of greater than or about 35 nm/min. In some embodiments, a temperature of the substrate during the removing may be maintained above or about 200° C., and the remote plasma may be formed at a plasma power of greater than or about 2.0 kW. The substrate may include an exposed region of titanium nitride, and the etchant mixture may also include ammonia.

Such technology may provide numerous benefits over conventional systems and techniques. For example, materials according to embodiments of the present technology may improve selectivity to a variety of materials being etched. This may allow thinner layers to be used for patterning, which may reduce risks associated with pattern transfer, including structural twists due to etchant collisions and critical dimension loss due to etch timing. Additionally, the present technology may improve etching removal of the mask materials, which can improve throughput for semiconductor processing. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 4 shows exemplary operations in an integration method according to some embodiments of the present technology.

FIGS. 5A-5B show schematic isometric partial views of a substrate during a pattern transfer process according to some embodiments of the present technology.

Figure 1:
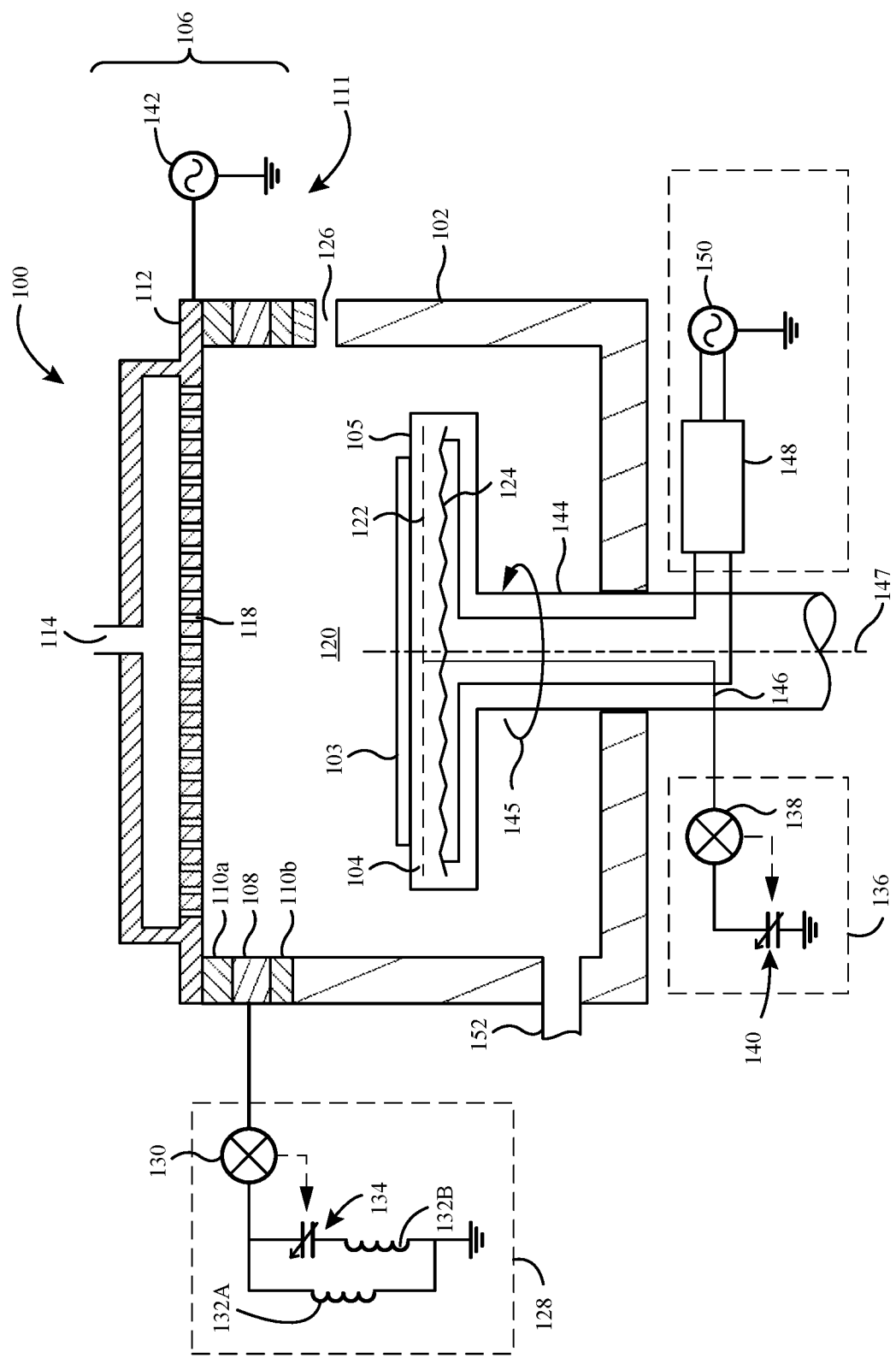
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor fabrication, structures may be produced on a substrate utilizing a variety of deposition and etching operations. Mask materials may be used to allow materials to be partially etched, or etched to produce features across the substrate. As device sizes continue to reduce, and improved selectivity between materials may ease structural formation, utilizing improved hard masks may facilitate fabrication. For example, compared to a thermally produced amorphous silicon hard mask, a silicon film incorporating boron may be characterized by improved hardness and other material properties, facilitating the film use as a mask material. Increased hardness may improve utilization of the mask material for any number of processes. For example, a number of memory structures may include formation of high-aspect-ratio apertures. Capacitor contactors may be formed in DRAM structures, memory holes or contact opening may be formed in 3D NAND, and storage node contacts may be formed. Utilizing harder films as a mask may help maintain local critical dimension uniformity across the substrate, and may allow thinner films to be utilized. However, the increased hardness may challenge etching and removal of the mask or sacrificial layer.

The present technology may overcome these limitations by utilizing tunable boron-containing and silicon-and-boron-containing films for semiconductor processing. Additionally, by utilizing improved processes for etching and removal, throughput may not be detrimentally impacted. Additionally, removal rates according to some embodiments of the present technology may be improved by adjusting chamber structures and configurations to facilitate increased etch rates at high selectivity. This may facilitate quickly removing residual materials while substantially or fully maintaining other materials exposed during the removal. After describing general aspects of chambers according to some embodiments of the present technology in which plasma processing operations discussed below may be performed, specific methodology may be discussed. It is to be understood that the present technology is not intended to be limited to the specific films, chambers, or processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may perform one or more deposition or other processing operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
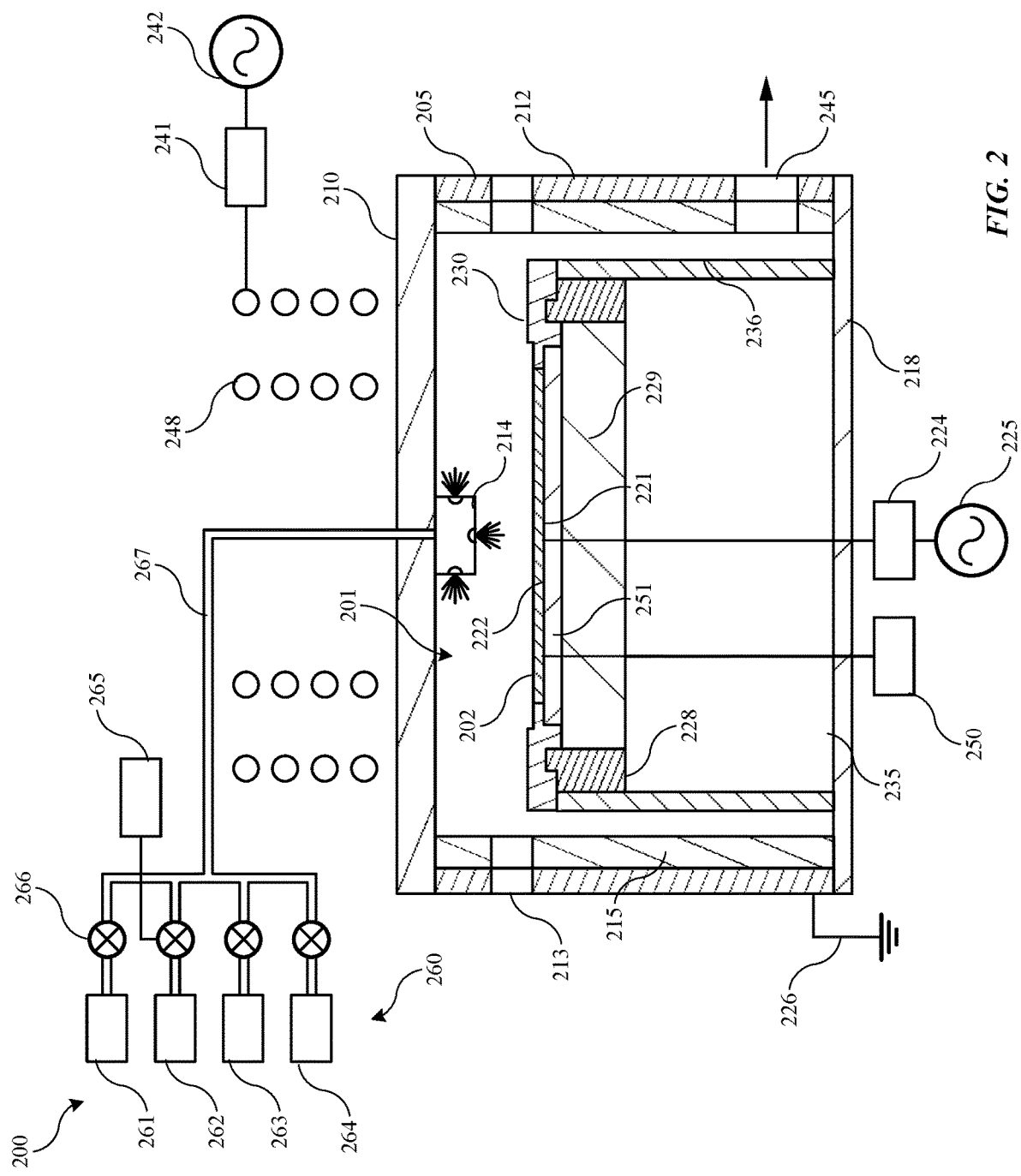
FIG. 2 shows a schematic cross-sectional view of an exemplary processing chamber according to some embodiments of the present technology.

FIG. 2 illustrates a schematic cross-sectional view of an exemplary processing chamber 200 suitable for patterning a material layer disposed on a substrate 202 in the processing chamber 200. For example, chamber 200 may be an exemplary etching chamber that can be configured to facilitate pattern transfer or etching of materials according to the present technology, including boron-containing materials and boron-and-silicon-containing materials. The exemplary processing chamber 200 may be suitable for performing a patterning process, although it is to be understood that aspects of the present technology may be performed in any number of chambers configured to perform operations according to embodiments of the present technology. The plasma processing chamber 200 may include a chamber body 205 defining a processing region 201 in which a substrate may be processed. The chamber body 205 may have sidewalls 212 and a bottom 218 which are coupled with ground 226. The sidewalls 212 may have a liner 215 to protect the sidewalls 212 and extend the time between maintenance cycles of the plasma processing chamber 200. The dimensions of the chamber body 205 and related components of the plasma processing chamber 200 are not limited and generally may be proportionally larger than the size of the substrate 202 to be processed therein. Examples of substrate sizes include 200 mm diameter, 250 mm diameter, 300 mm diameter and 450 mm diameter, among others, such as display or solar cell substrates as well.

The chamber body 205 may support a chamber lid assembly 210 to enclose the processing region 201. The chamber body 205 may be fabricated from aluminum or other suitable materials. A substrate access port 213 may be formed through the sidewall 212 of the chamber body 205, facilitating the transfer of the substrate 202 into and out of the plasma processing chamber 200. The access port 213 may be coupled with a transfer chamber and/or other chambers of a substrate processing system as previously described. A pumping port 245 may be formed through the sidewall 212 of the chamber body 205 and connected to the processing region 201. A pumping device may be coupled through the pumping port 245 to the processing region 201 to evacuate and control the pressure within the processing volume. The pumping device may include one or more pumps and throttle valves.

A gas panel 260 may be coupled by a gas line 267 with the chamber body 205 to supply process gases into the processing region 201. The gas panel 260 may include one or more process gas sources 261, 262, 263, 264 and may additionally include inert gases, non-reactive gases, and reactive gases, as may be utilized for any number of processes. Examples of process gases that may be provided by the gas panel 260 include, but are not limited to, hydrocarbon-containing gas including methane, sulfur hexafluoride, silicon chloride, carbon tetrafluoride, hydrogen bromide, argon, chlorine, nitrogen, helium, or oxygen, as well as any number of additional materials. Additionally, process gasses may include any number of nitrogen, chlorine, fluorine, oxygen, and hydrogen-containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$, among any number of additional precursors.

Valves 266 may control the flow of the process gases from the sources 261, 262, 263, 264 from the gas panel 260 and may be managed by a controller 265. The flow of the gases supplied to the chamber body 205 from the gas panel 260 may include combinations of the gases form one or more sources. The lid assembly 210 may include a nozzle 214. The nozzle 214 may be one or more ports for introducing the process gases from the sources 261, 262, 263, 264 of the gas panel 260 into the processing region 201. After the process gases are introduced into the plasma processing chamber 200, the gases may be energized to form plasma. An antenna 248, such as one or more inductor coils, may be provided adjacent to the plasma processing chamber 200. An antenna power supply 242 may power the antenna 248 through a match circuit 241 to inductively couple energy, such as RF energy, to the process gas to maintain a plasma formed from the process gas in the processing region 201 of the plasma processing chamber 200. Alternatively, or in addition to the antenna power supply 242, process electrodes below the substrate 202 and/or above the substrate 202 may be used to capacitively couple RF power to the process gases to maintain the plasma within the processing region 201. The operation of the power supply 242 may be controlled by a controller, such as controller 265, that also controls the operation of other components in the plasma processing chamber 200.

A substrate support pedestal 235 may be disposed in the processing region 201 to support the substrate 202 during processing. The substrate support pedestal 235 may include an electrostatic chuck 222 for holding the substrate 202 during processing. The electrostatic chuck ("ESC") 222 may use the electrostatic attraction to hold the substrate 202 to the substrate support pedestal 235. The ESC 222 may be powered by an RF power supply 225 integrated with a match circuit 224. The ESC 222 may include an electrode 221 embedded within a dielectric body 251. The electrode 221 may be coupled with the RF power supply 225 and may provide a bias which attracts plasma ions, formed by the process gases in the processing region 201, to the ESC 222 and substrate 202 seated on the pedestal. The RF power supply 225 may cycle on and off, or pulse, during processing of the substrate 202. The ESC 222 may have an isolator 228 for the purpose of making the sidewall of the ESC 222 less attractive to the plasma to prolong the maintenance life cycle of the ESC 222. Additionally, the substrate support pedestal 235 may have a cathode liner 236 to protect the sidewalls of the substrate support pedestal 235 from the plasma gases and to extend the time between maintenance of the plasma processing chamber 200.

Electrode 221 may be coupled with a power source 250. The power source 250 may provide a chucking voltage of about 200 volts to about 2000 volts to the electrode 221. The power source 250 may also include a system controller for controlling the operation of the electrode 221 by directing a DC current to the electrode 221 for chucking and de-chucking the substrate 202. The ESC 222 may include heaters disposed within the pedestal and connected to a power source for heating the substrate, while a cooling base 229 supporting the ESC 222 may include conduits for circulating a heat transfer fluid to maintain a temperature of the ESC 222 and substrate 202 disposed thereon. The ESC 222 may be configured to perform in the temperature range required by the thermal budget of the device being fabricated on the substrate 202. For example, the ESC 222 may be configured to maintain the substrate 202 at a temperature of about $-150°$ C. or lower to about $500°$ C. or higher depending on the process being performed.

The cooling base 229 may be provided to assist in controlling the temperature of the substrate 202. To mitigate process drift and time, the temperature of the substrate 202 may be maintained substantially constant by the cooling base 229 throughout the time the substrate 202 is in the cleaning chamber. In some embodiments, the temperature of the substrate 202 may be maintained throughout subsequent cleaning processes at temperatures between about $-150°$ C. and about $500°$ C., although any temperatures may be utilized. A cover ring 230 may be disposed on the ESC 222 and along the periphery of the substrate support pedestal 235. The cover ring 230 may be configured to confine etching gases to a desired portion of the exposed top surface of the substrate 202, while shielding the top surface of the substrate support pedestal 235 from the plasma environment inside the plasma processing chamber 200. Lift pins may be selectively translated through the substrate support pedestal 235 to lift the substrate 202 above the substrate support pedestal 235 to facilitate access to the substrate 202 by a transfer robot or other suitable transfer mechanism as previously described.

The controller 265 may be utilized to control the process sequence, regulating the gas flows from the gas panel 260 into the plasma processing chamber 200, and other process parameters. Software routines, when executed by the CPU, may transform the CPU into a specific purpose computer such as a controller, which may control the plasma processing chamber 200 such that the processes are performed in accordance with the present disclosure. The software routines may also be stored and/or executed by a second controller that may be associated with the plasma processing chamber 200.

Figure 3:
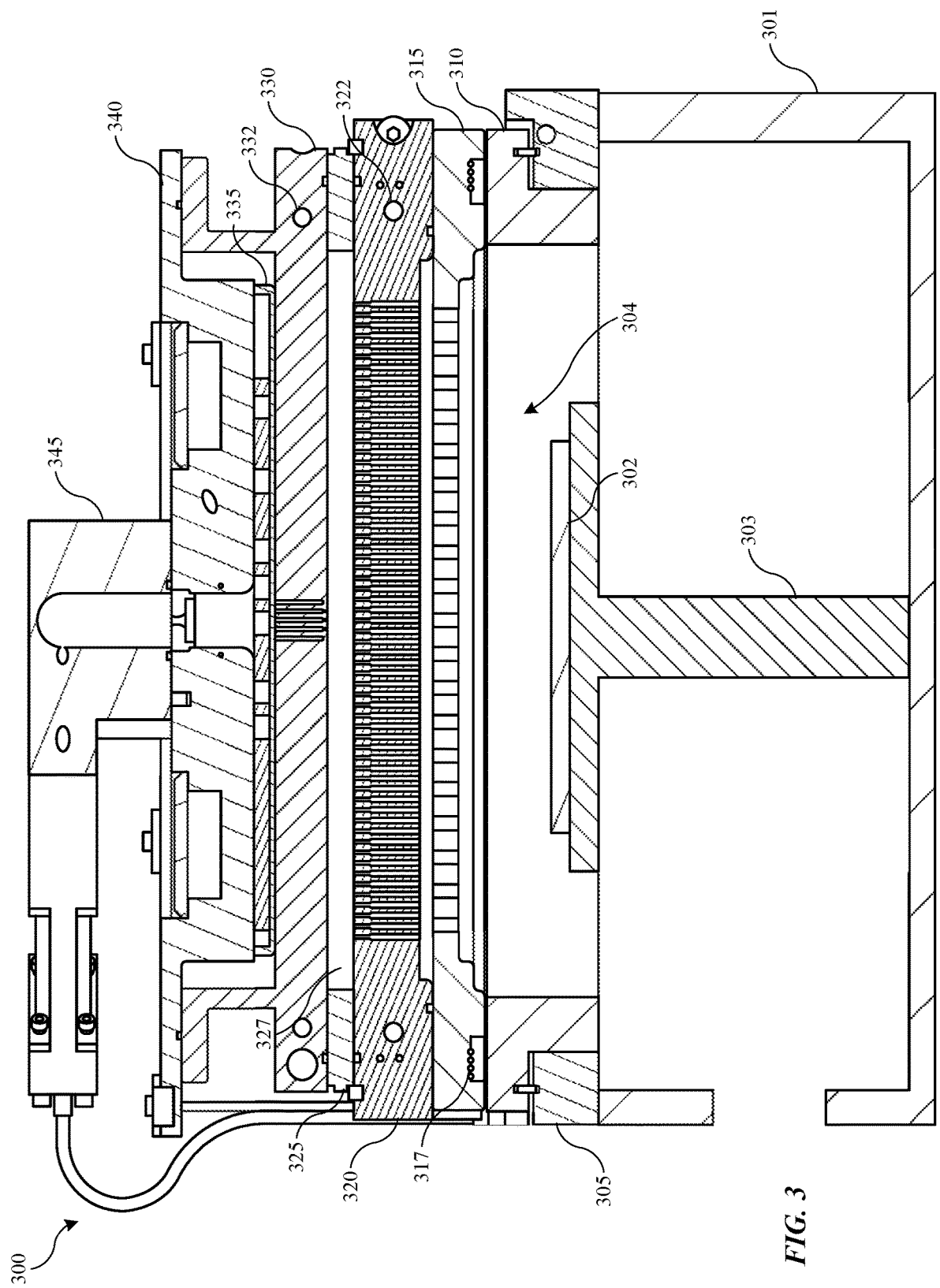
FIG. 3 shows a schematic cross-sectional view of an exemplary processing chamber according to some embodiments of the present technology.

FIG. 3 shows a schematic cross-sectional view of an exemplary processing chamber 300 according to some embodiments of the present technology. Processing chamber 300 may be suitable for performing material removal on a substrate 302 in the processing chamber 300. For example, chamber 300 may be an exemplary etching or removal chamber that can be configured to facilitate removal of materials according to the present technology, including boron-containing materials and boron-and-silicon-containing materials.

FIG. 3 may illustrate components seated on a chamber body 301, such as on a lid plate 305, which may define multiple process regions for a tandem chamber, standalone chambers, or any other configurations that may benefit from one or more of the components of the stack. The lid stack may include a spacer 310 seated on the lid plate, and which may radially define a processing region 304 into which a pedestal or other substrate support may extend with a substrate as previously described. A pedestal 303 or other substrate support may extend through chamber body 301 and may support substrate 302, which may include boron-containing materials or boron-and-silicon-containing materials as described throughout the present technology. Defining the processing region from above may be a showerhead 315, which may be seated on the spacer 310. Showerhead 315 illustrates a single channel showerhead, although it is to be understood that a dual channel showerhead may be used as well. Showerhead 315 may include resistive elements 317, which may be used to heat the showerhead during operation.

Overlying the showerhead 315 may be an electrode 320 seated on the showerhead, although in some embodiments thermal spacers may at least partially separate the two components where the showerhead may be heated while the electrode may be cooled, for example. The electrode may define or include a channel 322 extending about the plate and through which a temperature-controlled fluid may be flowed. An isolator 325 may be seated overlying the electrode, and a faceplate 330 may be seated on the isolator. The faceplate may include a channel 332 defined within the faceplate for a temperature-controlled fluid to be flowed. The electrode, faceplate, and isolator may define a remote plasma region 327 between the components, and in which a capacitively-coupled plasma may be formed. The isolator may electrically isolate the faceplate from the electrode, which may allow the components to be charged or grounded to form a plasma of precursors flowed into the remote plasma region. In some embodiments, the hot electrode, which may be the faceplate, for example, may be powered at higher power, which may increase ion density for increasing etch rates.

Some embodiments of the present technology may afford high etch rates of mask or other materials. Accordingly, the capacitively-coupled plasma formable between the faceplate and the electrode may be produced at increased plasma power to increase plasma density within the space, and increase plasma effluent production to increase etching of substrate materials within the processing region. In some embodiments, the plasma may be produced at a plasma power of greater than or about 2.0 kW, and may be produced at a plasma power of greater than or about 2.5 kW, greater than or about 3.0 kW, greater than or about 3.5 kW, greater than or about 4.0 kW, greater than or about 4.5 kW, greater than or about 5.0 kW, greater than or about 5.5 kW, greater than or about 6.0 kW, or higher. However, this increased plasma power may increase plasma effects within the chamber.

For example, many of the surfaces or component parts may be coated with protective coatings to improve erosive and/or corrosive effects within the remote plasma region. For example, oxide coatings may be formed over the parts, which may be aluminum or any other material used in semiconductor chambers. One such oxide coating may be yttrium oxide. As the plasma power increases within the remote plasma region, the temperature of the electrodes and adjacent components may similarly increase due to the plasma energy. This may cause increased bombardment of coated surfaces, and increase plasma effects on corners and other materials. Additionally, some coatings, such as yttrium oxide may begin to decompose as temperatures extend over 150° C. or more. Accordingly, to limit this coating degradation, a fluid may be flowed through the channel 322 formed in the electrode 320, to maintain the temperature below or about 150° C., below or about 125° C., below or about 100° C., below or about 90° C., below or about 80° C., below or about 70° C., below or about 60° C., below or about 50° C., or less, during processing.

Additionally, aperture profiles of apertures formed within the faceplate and the electrode may be adjusted to further reduce damage. For example, in some conventional technologies, one or more apertures of the faceplate and electrode may be characterized by a conical or tapered section extending to the surface facing the remote plasma region. These regions may be more difficult to coat with protective materials, such as yttrium oxide or other oxide coatings, and the coating thickness may decrease further into the conical portion. Additionally, the conical portions may limit the amount of flat surface between adjacent cones, which may increase charge accumulation in these regions, and which may further increase defects in coating, all of which may increase a likelihood of arcing within the region. The conical portions may also facilitate a hollow cathode effect within the cones, which may draw plasma further into the conical portion and further increase damage to thinner coatings within the conical portion. Although some conventional technologies may accept arcing or damage to coatings when lower plasma power may be used, such as less than 2.5 kW or less than 1.0 kW, the risk of arcing may be less and damage produced may be lower. At high plasma power, such as may be used in some embodiments of the present technology, these materials can much further damage parts and increase particle displacement to the substrate. The present technology may modify one or more aspects to limit or prevent arcing during high-power plasma formation.

For example, in some embodiments apertures formed through the faceplate and the electrode may be characterized by counterbore or countersunk profiles extending in a direction towards the remote plasma region as illustrated, where the apertures may be characterized by a reduced diameter extending to the surface facing the remote plasma region, and a greater diameter or taper extending to the opposite surface. This may facilitate coating operations on plasma-facing surfaces, which may improve part protection from high energy plasma species, and limit sharp or pronounced edges more likely to produce arc paths.

A blocker plate 335 may be seated in a recess of the faceplate, and bolted to a gasbox 340 coupled at an outer edge with the faceplate. An outlet manifold 345 may be coupled with the gasbox, which may include an internal plenum to allow gases to mix prior to being delivered into the chamber. Electrode 320 may be an ion suppressor which may allow ions formed in the capacitively coupled plasma to be filtered from the plasma effluents, which may allow etching to be performed substantially or exclusively by radical species, which may protect structures and increase selectivity. Electrode 320 may operate as one of two electrodes for generating a remote plasma within the processing chamber, as described above. Electrode 320 may be a monolithic component in some embodiments, as illustrated, and may include a channel 322 defined within the electrode, which may extend about the electrode. As discussed above, the channel may allow temperature control of the electrode 320 during processing in some embodiments. Electrode 320 may be characterized by a first surface facing the remote plasma region, and may be characterized by a second surface opposite the first surface, which may be facing the showerhead, for example. As illustrated, a recess may be formed within the second surface of the electrode, which may increase fluid mixing and distribution within the chamber.

Electrodes utilized conventionally may have also included a recess defined within the first surface of the electrode, which may partially define a plasma envelope within the remote plasma region. As shown similar to the recess formed along the second surface of the electrode, the recess may produce a corner profile about the recess. While this setup may operate sufficiently during some conventional capacitively-coupled plasma processes where plasma power may be less than 1,000 Watts, in some embodiments of the present technology where plasma power may be several thousand Watts, these corner profiles may cause multiple issues. For example, corner profiles may be more difficult to plasma coat with protective layers, similar to as described above, and thus coating may be thinner or include gaps in these regions increasing the opportunity for damage. Additionally, the plasma profiles within the remote plasma region may include increased edge density or electrical field concentration, which can further damage coatings within the region. Where coatings may be less complete, or thinner, damage may be more likely. Additionally at the upper ridge of the recess, increased charge density may accumulate, which may also increase the likelihood of arcing and material damage, which can further lead to increased particles on substrates being processed.

Consequently, electrodes according to some embodiments of the present technology may be characterized by a substantially planar profile in an active region of the processing chamber. Electrode 320 may include a substantially flat surface across a surface of the electrode facing the faceplate, which may extend out to regions past an inner annular edge of an isolator 325, to a region where an o-ring or elastomeric element may be seated between the components. This may facilitate surface coatings of the electrode, and the faceplate may similarly be characterized by a substantially planar surface, which may also be coated with a protective material as described above. Apertures defined through the faceplate and the electrode may be characterized by a counterbore or countersunk profile facing one another as discussed above, where a portion characterized by a reduced diameter may extend to a surface of the component facing or defining the remote plasma region. No conical or tapered section may be included at a surface of the components facing the remote plasma region, which may cause coating challenges and increase arcing potential as discussed above.

Because a recess in the surface of components facing the remote plasma region may in part define the plasma region, and to maintain similar plasma profile properties where the faceplate and electrode may be characterized by substantially planar profiles along these surfaces, the isolator may be modified to maintain the remote plasma region characteristics. For example, in some embodiments, the recess distances may be incorporated into the isolator to maintain electrode spacing within the remote plasma region. Accordingly, in some embodiments the isolator may be characterized by a thickness or height of at least about 5 mm, and may be characterized by a height of greater than or about 6 mm, greater than or about 7 mm, greater than or about 8 mm, greater than or about 9 mm, greater than or about 10 mm, greater than or about 11 mm, greater than or about 12 mm, greater than or about 13 mm, greater than or about 14 mm, greater than or about 15 mm, or more, which may maintain properties of the plasma between the electrodes.

Additionally, remote plasma regions may be characterized by increased plasma density at edge regions of the plasma envelope, which may increase the possibility of issues in these regions. To control the plasma envelope within the remote plasma region, apertures through the components may not extend radially outward as far along the plate. For example, in some embodiments, one or more of the components may be free of apertures a distance from an edge of the remote plasma region. For example, and as illustrated, in some embodiments the electrode may not include apertures within a region extending a distance to an inner annular radius of the isolator. For example, no apertures may be formed through the electrode a radial distance greater than or about 2 mm from an inner annular edge of the isolator, and no apertures may be formed a distance greater than or about 3 mm, greater than or about 4 mm, greater than or about 5 mm, greater than or about 6 mm, greater than or about 7 mm, greater than or about 8 mm, greater than or about 9 mm, greater than or about 10 mm, greater than or about 11 mm, greater than or about 12 mm, greater than or about 13 mm, greater than or about 14 mm, greater than or about 15 mm, or more. This may further control plasma effects within the remote plasma region.

The exemplary chambers described above may be utilized in some embodiments of integration processes that may include formation, etching, and removal of materials as described above. It is to be understood that the chambers described are not to be considered limiting, and any chamber that may be configured to perform operations as described may be similarly used. The chambers may be connected on a single mainframe, or may be separated across mainframes for processing. FIG. 4 shows exemplary operations in an integration method 400 according to some embodiments of the present technology. The method may be performed in a variety of processing chambers and on one or more mainframes or tools, including any of processing chambers 100, 200, or 300 described above. Method 400 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 400 may describe operations shown schematically in FIGS. 5A-5B, the illustrations of which will be described in conjunction with the operations of method 400. It is to be understood that the figures illustrate only partial schematic views, and a substrate may contain any number of additional materials and features having a variety of characteristics and aspects as illustrated in the figures.

Method 400 may include additional operations prior to initiation of the listed operations. For example, additional processing operations may include forming structures on a semiconductor substrate, which may include both forming and removing material. For example, transistor structures, memory structures, or any other structures may be formed. Prior processing operations may be performed in the chamber in which method 400 may be performed, or processing may be performed in one or more other processing chambers prior to delivering the substrate into the semiconductor processing chamber or chambers in which method 400 may be performed. Regardless, method 400 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above.

A substrate on which several operations have been performed may be substrate 505 or structure 500, which may show one or more underlying structures. It is to be understood that structure 500 may show only a few top layers during processing to illustrate aspects of the present technology. However, it is to be understood that any number of layers, materials, or structures may be formed beneath the materials shown. For example, the substrate 505 may show materials through which one or more features may formed, and may show additional masking or structural layers. Substrate 505 may illustrate an oxide material 506, and an overlying etch stop layer, such as silicon nitride 508. Although these materials may be discussed throughout, it is to be understood that other underlying and substrate materials may be or include silicon, germanium, dielectric materials including silicon oxide or silicon nitride, metal materials, or any number of combinations of these materials, which may be the substrate 505, or materials formed on substrate 505.

At operation 405, a boron-containing or boron-and-silicon-containing material 510 may be deposited overlying the substrate 505. Aspects of exemplary deposition methods encompassed by the present technology may be discussed further below, such as with FIG. 6, for example. Subsequent the deposition of the mask material, additional processing may be performed prior to additional operations of the method. For example, a pattern to be transferred into the boron-and-silicon-containing material 510 may be applied in any number of ways. In one non-limiting example, an additional mask 512 may be formed overlying the boron-and-silicon-containing material, and a structure or pattern 514 may be formed through the mask, which may then be transferred into the boron-and-silicon-containing material 510. Mask 512 can be any sacrificial material, such as oxide or nitride, and a photolithography or other lithographic operation may be performed to produce pattern 514. Pattern 514 is illustrated as a set of equal apertures formed through the mask, such as may be used in forming cell capacitors for DRAM or memory holes for 3D NAND, but it is to be understood that any pattern may be produced, and the figures are not intended to limit the present technology.

At operation 410, the pattern may be transferred through the boron-and-silicon-containing material 510 and into the underlying structure, 508. The etching may remove a portion of the material 510, such as to produce the pattern through the material. FIG. 5B shows pattern 514 transferred as pattern 520 into the underlying boron-and-silicon-containing material. As described above, compared to amorphous silicon mask materials, boron-doped mask materials, or boron masks, may provide increased hardness and material strength. Consequently, a reduced thickness mask may be used. An advantage of reduced thickness may include reduced deposition time, but additional advantages may be realized during pattern transfer. For example, as a pattern transfer such as aperture opening is performed, the etch process may be affected by material thicknesses. For example, the further into the structure the etch is to be performed, the more likely etchant ions and radicals may impact sidewalls as they travel. This may cause an amount of rifling or twisting within the structure, which may affect material properties of anything later deposited within the apertures. Additionally, critical dimensions of the apertures may be impacted as longer etching processes increase etchant residence time, and the time that upper regions may be exposed to etchant materials. This may increase critical dimension loss, which may be more pronounced at edge regions, where additional chamber affects may cause additional etchant redirection within the chamber, again increasing isotropic aspects of removal. Accordingly, films produced according to the present technology may beneficially impact a number of processing aspects.

Although some embodiments of the present technology may afford reduced thickness masking, the present technology may produce material thicknesses across a large range. For example, deposition processes according to embodiments of the present technology may produce boron-containing or boron-and-silicon-containing materials, which may be conformal in some embodiments, and may be characterized by a material thickness of greater than or about 10 nm, and may be characterized by a thickness of greater than or about 20 nm, greater than or about 30 nm, greater than or about 50 nm, greater than or about 75 nm, greater than or about 100 nm, greater than or about 200 nm, greater than or about 300 nm, greater than or about 400 nm, greater than or about 500 nm, greater than or about 600 nm, greater than or about 700 nm, greater than or about 800 nm, greater than or about 900 nm, greater than or about 1,000 nm, or more.

Subsequent the pattern transfer operation, additional etching operations may be performed in some embodiments, which may further transfer the pattern into the underlying structures, such as down to contacts or other interconnect materials. After final pattern transferring or etching may be performed, the boron-and-silicon-containing material may be removed from the structure at operation 415. As discussed above, the incorporation of boron may increase film hardness and resistance to etching. Conventional etching may be limited to slow etch rates, or poor selectivities relative to other exposed materials. Accordingly, removal operations according to the present technology may afford rapid removal of the material from underlying structures, while maintaining high selectivity to the exposed materials. By utilizing chambers configured to produce plasma at higher plasma power without arcing or damaging the chamber, improved removal may be performed.

Figure 6:
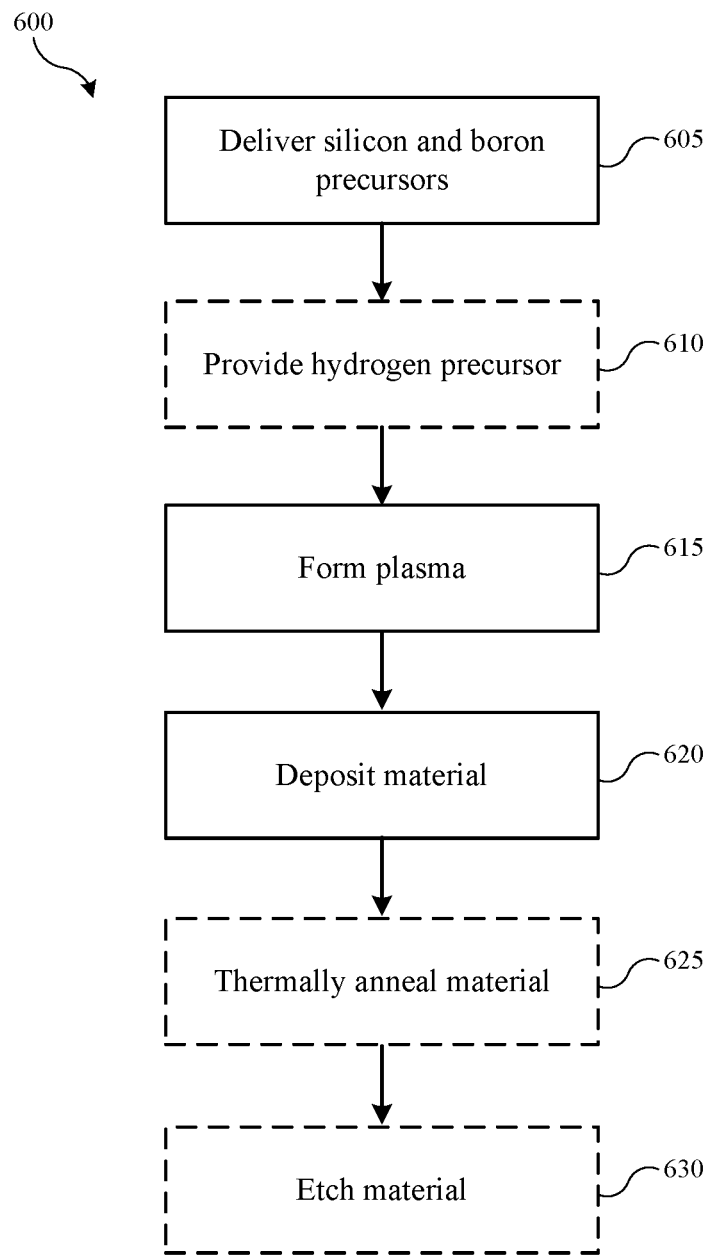
FIG. 6 shows exemplary operations that may be included in methods according to some embodiments of the present technology.

The individual deposition, etching, and removal operations according to the present technology may include any number of additional aspects, operations, or features, that will be described below. It is to be understood that any aspect of any individual process may be incorporated within integration methods according to embodiments of the present technology. FIG. 6 shows exemplary operations of a deposition method 600 that may be included in an integration method according to some embodiments of the present technology. The method may be performed in a variety of processing chambers, including processing chamber 100 described above. Method 600 may include a number of optional operations, which may or may not be specifically associated with some embodiments of methods according to the present technology. Additionally, any aspect of method 600 may be considered as optional within broader integration methods into which any number of aspects of method 600 may be incorporated. For example, many of the operations are described in order to provide a broader scope of the structural formation, but are not critical to the technology, or may be performed by alternative methodology as would be readily appreciated.

Method 600 may include additional operations prior to initiation of the listed operations. For example, additional processing operations may include forming structures on a semiconductor substrate, which may include both forming and removing material. Prior processing operations may be performed in the chamber in which method 600 may be performed, or processing may be performed in one or more other processing chambers prior to delivering the substrate into the semiconductor processing chamber in which method 600 may be performed. Regardless, method 600 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above.

The substrate may be any number of materials on which materials may be deposited, such as described above. In some embodiments optional treatment operations, such as a pretreatment, may be performed to prepare a surface of the substrate for deposition. For example, a pretreatment may be performed to provide certain ligand terminations on the surface of the substrate, and which may facilitate nucleation of a film to be deposited. For example, hydrogen, oxygen, carbon, nitrogen, or other molecular terminations, including any combination of these atoms or radicals, such as amidogen or other functional groups, as non-limiting examples, may be adsorbed, reacted, or formed on a surface of the substrate. Additionally, material removal may be performed, such as reduction of native oxides or etching of material, or any other operation that may prepare one or more exposed surfaces of the substrate for deposition.

At operation 605, one or more precursors may be delivered to the processing region of the chamber. For example, in exemplary embodiments in which a boron-incorporated silicon film may be formed, a silicon-containing precursor and a boron-containing precursor may be delivered to the processing region of the processing chamber. Plasma enhanced deposition may be performed in some embodiments of the present technology, which may facilitate material reactions and deposition. Some embodiments of the present technology may encompass formation or deposition of silicon-and-boron materials, which may be characterized conventionally by increased surface roughness, such as in comparison to a thermally produced silicon film, for example. Nucleation of these silicon-and-boron materials may form islands on the substrate in some embodiments. These islands may form three-dimensionally to different heights during initial film formation, which may be maintained during film growth.

Some embodiments of the present technology may include additionally providing a hydrogen-containing precursor at optional operation 610, and which is provided with the silicon-containing precursor and the boron-containing precursor. The precursors delivered may all be used to form a plasma within the processing region of the semiconductor processing chamber at operation 615. At operation 620, a silicon-and-boron material may be deposited on the substrate. By incorporating a hydrogen-containing precursor in some embodiments, islands formed during nucleation may be reduced or limited.

By incorporating an additional hydrogen source, a film modification, or profile etch may be performed simultaneously with the deposition of material. For example, through reaction and/or physical interaction with features being formed of the silicon-and-boron material, hydrogen-radicals may trim the island formation while a more uniform profile of formation is being produced. Consequently, the islands may not extend to as great a degree relative to conventional processes. To provide sufficient hydrogen radicals in the process, the hydrogen-containing precursor may be included at a greater flow rate than one or both of the silicon-containing precursor or the boron-containing precursor. For example, in some embodiments a flow rate ratio of the hydrogen-containing precursor to either or both of the silicon-containing precursor and/or the boron-containing precursor may be greater than or about 1:1, and in some embodiments may be greater than or about 2:1, greater than or about 3:1, greater than or about 4:1, greater than or about 5:1, greater than or about 6:1, greater than or about 8:1, greater than or about 10:1, greater than or about 15:1, greater than or about 20:1, greater than or about 25:1, greater than or about 30:1, greater than or about 35:1, greater than or about 40:1, greater than or about 45:1, greater than or about 50:1, or more. As will be explained further below, in some embodiments a further dilution may be performed in which a ratio of hydrogen to silicon and/or boron precursors may be greater than or about 100:1, and may be greater than or about 500:1, greater than or about 1,000:1, greater than or about 1,500:1, greater than or about 2,000:1, greater than or about 2,500:1, or more.

For example, depending on the precursors used, a silicon-containing precursor may be delivered at a flow rate less than or about 500 sccm, and may be delivered at a flow rate less than or about 400 sccm, less than or about 300 sccm, less than or about 200 sccm, less than or about 100 sccm, less than or about 90 sccm, less than or about 80 sccm, less than or about 70 sccm, less than or about 60 sccm, less than or about 50 sccm, or less. Similarly, a boron-containing precursor may be delivered at a flow rate less than or about 1,000 sccm, and may be delivered at a flow rate less than or about 800 sccm, less than or about 600 sccm, less than or about 500 sccm, less than or about 450 sccm, less than or about 400 sccm, less than or about 350 sccm, less than or about 300 sccm, less than or about 250 sccm, less than or about 200 sccm, or less. Any additional ranges within these ranges or as combinations of any stated or unstated number may also be used.

A hydrogen-containing precursor may be delivered at greater than or about 1,000 sccm, and may be delivered at a flow rate of greater than or about 1,200 sccm, greater than or about 1,400 sccm, greater than or about 1,600 sccm, greater than or about 1,800 sccm, greater than or about 2,000 sccm, greater than or about 2,200 sccm, greater than or about 2,400 sccm, greater than or about 2,600 sccm, greater than or about 2,800 sccm, greater than or about 3,000 sccm, or more. Increasing the hydrogen-containing precursor may further smooth the surface of the film being deposited, however, increased hydrogen incorporation may occur within the deposited film. Accordingly, in some embodiments, the hydrogen-containing precursor may be delivered at a flow rate of less than or about 4,000 sccm, and may be delivered at a flow rate of less than or about 3,800 sccm, less than or about 3,600 sccm, less than or about 3,400 sccm, less than or about 3,200 sccm, less than or about 3,000 sccm, less than or about 2,800 sccm, less than or about 2,600 sccm, or less. Additionally, in some embodiments in which higher dilution may be performed, the hydrogen-containing precursor may be delivered at a flow rate of greater than or about 5,000 sccm, and may be delivered at a flow rate of greater than or about 10,000 sccm, greater than or about 15,000 sccm, greater than or about 20,000 sccm, greater than or about 25,000 sccm, or more. In some embodiments, the flow rates of the silicon or boron precursors may be further reduced, such as to less than or about 200 sccm, and may be reduced to less than or about 150 sccm, less than or about 100 sccm, less than or about 50 sccm, less than or about 30 sccm, less than or about 20 sccm, less than or about 10 sccm, or less.

The film may be deposited to any thickness on the substrate. Surface roughness of the produced film may not be limited to issues during film nucleation as noted above. For example, film growth and plasma termination may also affect surface roughness in some aspects of the present technology. For example, when sufficient film growth has occurred, the process may be halted by extinguishing the plasma within the processing chamber, such as by halting power to a plasma-generating electrode, for example. Plasma termination may also increase surface roughness by causing an amount of residual ion physical interaction after deposition has completed. Both nucleation effects and plasma termination effects may be estimated to be consistent regardless of thickness of the film formed. However, testing has shown that roughness of the deposited film increases as film thickness increases. Consequently, roughness effects occur during film growth as well, and as film thickness increases, roughness of the film may further increase as well. Hence, a produced film may be characterized by increased roughness that may affect uniformity of subsequent etching.

For example, thermally produced silicon, such as polysilicon or other silicon materials, may be characterized by relatively low average roughness, such as less than or about 0.5 nm, or less than or about 0.2 nm. The film may also be characterized by a relatively low roughness range, such as the difference between a highest peak and a lowest peak on the formed film. For example, the roughness range may be less than or about 1.5 nm, or less than or about 1 nm. However, for silicon-and-boron films produced without one or more aspects of the present technology, an average roughness may be greater than or about 2 nm, greater than or about 3 nm, or more, for a similar thickness film, although as noted roughness may increase with increased film thickness. Moreover, the range of roughness of the produced silicon-and-boron material may be greater than or about 10 nm, and may be greater than or about 15 nm, or more, again depending on the film thickness. During subsequent etching operations, these larger disparities across the film may challenge etching operation uniformity, and may require additional operations to be performed, such as an additional chemical-mechanical polishing operations.

The present technology, however, may reduce or greatly reduce both the average roughness and the range of roughness of produced silicon-and-boron films by performing a substantially simultaneous etch utilizing additional hydrogen-containing precursors, or by performing one or more additional adjustments described further below. A produced film may be characterized by an average roughness of less than or about 2 nm, and may be characterized by an average roughness of less than or about 1.5 nm, less than or about 1.0 nm, less than or about 0.9 nm, less than or about 0.8 nm, less than or about 0.7 nm, less than or about 0.6 nm, less than or about 0.5 nm, less than or about 0.4 nm, less than or about 0.3 nm, less than or about 0.2 nm, or less. Additionally, the roughness may be substantially controlled regardless of film thickness in some embodiments. This may allow avoidance of additional chemical-mechanical polishing operations, as the as-deposited film may be characterized by any of the average roughness ranges illustrated. Additionally, the roughness range across the as-deposited film may be less than or about 10 nm, and may be less than or about 9 nm, less than or about 8 nm, less than or about 7 nm, less than or about 6 nm, less than or about 5 nm, less than or about 4 nm, less than or about 3 nm, less than or about 2 nm, less than or about 1 nm, or less. Consequently, improved materials may be produced, which may afford film and mask benefits over conventional materials and processes, as well as potentially reducing fabrication operations by limiting or reducing the number of polishing operations in a sequence.

Any number of precursors may be used with the present technology with regard to the silicon-containing precursor and the boron-containing precursor. For example, the silicon-containing precursor may include any silicon-containing material, such as organosilanes, which may include silane, disilane, and other materials including higher-order silanes. Additional silicon-containing materials may include silicon, carbon, oxygen, or nitrogen, such as trisilylamine. Boron-containing materials may include boranes, such as borane, diborane, or other multicenter-bonded boron materials, as well as any other boron-containing materials that may be used to produce silicon-and-boron-containing materials. For example, boron-containing materials may include dimethylamine borane, trimethylborane, triethylborane, or any other boron-containing material or combination of boron-containing materials. The boron incorporation in the silicon film may be based on any percentage incorporation. For example, the produced film may include greater than or about 5 at. % boron incorporation, and in some embodiments may include greater than or about 10 at. % boron incorporation, greater than or about 15 at. % boron incorporation, greater than or about 20 at. % boron incorporation, greater than or about 25 at. % boron incorporation, greater than or about 30 at. % boron incorporation, greater than or about 35 at. % boron incorporation, greater than or about 40 at. % boron incorporation, greater than or about 45 at. % boron incorporation, greater than or about 50 at. % boron incorporation, greater than or about 55 at. % boron incorporation, greater than or about 60 at. % boron incorporation, greater than or about 65 at. % boron incorporation, greater than or about 70 at. % boron incorporation, greater than or about 75 at. % boron incorporation, greater than or about 80 at. % boron incorporation, greater than or about 85 at. % boron incorporation, greater than or about 90 at. % boron incorporation, greater than or about 95 at. % boron incorporation, and may include 100 at. % boron incorporation such as a boron film that includes no silicon and is an essentially pure boron film, or boron and hydrogen film.

One or more additional aspects of the deposition may also be tuned to improve aspects of the deposition being performed. For example, the plasma power may impact the extent of hydrogen dissociation. Any number of hydrogen-containing precursors may be used, and in some embodiments diatomic hydrogen may be included. For some silicon-and-boron-containing materials, the materials are sufficiently reactive at deposition temperatures that minimal plasma enhancement may be included. For example, some conventional technologies utilize a plasma power of less than or about 200 Watts. The present technology may utilize higher or much higher plasma power, which may facilitate hydrogen dissociation, and may increase hydrogen radicals, which may reduce roughness as previously explained.

For example, in some embodiments the plasma power may be maintained at greater than or about 1,000 Watts, and may be maintained at greater than or about 1,200 Watts, greater than or about 1,400 Watts, greater than or about 1,600 Watts, greater than or about 1,800 Watts, greater than or about 2,000 Watts, greater than or about 2,200 Watts, greater than or about 2,400 Watts, greater than or about 2,600 Watts, greater than or about 2,800 Watts, greater than or about 3,000 Watts, or higher. This enhanced plasma power may also improve other precursor dissociation and activation, which may increase a deposition rate as well. Consequently, despite a simultaneous etch of the material during deposition, deposition rates of the film may be comparable if not improved over conventional deposition. The deposition and simultaneous etch for profile modification may then be maintained continuously or sequentially until a target film thickness has been produced. Depending on the plasma process being performed, a plasma power density may also be maintained, which may allow modulation of frequency and power. For example, in some embodiments plasma power density may be maintained greater than or about $0.25 \text{ W/cm}^2$, and may be maintained at greater than or about $0.5 \text{ W/cm}^2$, greater than or about $1.0 \text{ W/cm}^2$, greater than or about $1.5 \text{ W/cm}^2$, greater than or about $2.0 \text{ W/cm}^2$, greater than or about $2.5 \text{ W/cm}^2$, or higher.

The temperatures of the substrate may additionally impact the deposition. For example, in some embodiments the substrate may be maintained at a temperature of greater than or about 400° C., and may be maintained at a temperature of greater than or about 420° C., greater than or about 440° C., greater than or about 460° C., greater than or about 480° C., greater than or about 500° C., or greater. By performing the deposition according to some embodiments of the present technology, hydrogen etching may be performed during the deposition to reduce roughness of the formed film. However, the amount of hydrogen radicals produced, such as with the enhanced plasma and delivery of hydrogen, may also increase an amount of hydrogen incorporation in the film produced. This may increase a compressive stress within the film. For example, an as-deposited film may be characterized by a compressive stress of greater than or about −800 MPa, which may be based in part on the hydrogen incorporation. Consequently, in some embodiments, method 600 may include operations to reduce hydrogen incorporation in the film.

For example, in some embodiments, method 600 may include thermally annealing the formed silicon-and-boron-containing material at optional operation 625. While the deposition may be performed at a first temperature, the thermal anneal may be performed at a second temperature greater than the first. For example, the thermal anneal may be performed at a temperature greater than or about 480° C., and the thermal anneal may be performed at greater than or about 500° C., greater than or about 510° C., greater than or about 520° C., greater than or about 530° C., greater than or about 540° C., greater than or about 550° C., greater than or about 560° C., greater than or about 570° C., greater than or about 580° C., greater than or about 590° C., greater than or about 600° C., or higher. The thermal anneal may be performed for a period of time that may be greater than or about 0.5 minutes, and may be greater than or about 1 minute, greater than or about 2 minutes, greater than or about 3 minutes, greater than or about 4 minutes, greater than or about 5 minutes, greater than or about 6 minutes, or more.

By performing a thermal anneal, an amount of hydrogen incorporated within the film may be removed, which may relax a compressive stress. For example, in some embodiments, subsequent the thermal anneal, the compressive stress within the film may be maintained at less than or about −700 MPa, and may be less than or about −650 MPa, less than or about −600 MPa, less than or about −550 MPa, less than or about −500 MPa, less than or about −450 MPa, less than or about −400 MPa, less than or about −350 MPa, less than or about −300 MPa, less than or about −250 MPa, less than or about −200 MPa, less than or about −150 MPa, less than or about −100 MPa, or less.

The pressure within the processing region may affect the amount of ionization and physical interaction performed during the deposition. By lowering a processing pressure, increased ion interaction may occur. Accordingly, in some embodiments a processing pressure during the deposition may be maintained at less than or about 50 Torr, and may be maintained at less than or about 40 Torr, less than or about 30 Torr, less than or about 20 Torr, less than or about 15 Torr, less than or about 10 Torr, less than or about 9 Torr, less than or about 8 Torr, less than or about 7 Torr, less than or about 6 Torr, less than or about 5 Torr, less than or about 4 Torr, less than or about 3 Torr, less than or about 2 Torr, or less.

Testing has shown that argon incorporation may increase roughness, and thus limiting or excluding argon may improve film roughness. However, when argon is excluded from the processing precursors, testing has shown that film peeling may increase. Accordingly, in some embodiments argon may be nonetheless included with the silicon-containing precursor and the boron-containing precursor. To limit the effect on roughness, a flow rate ratio of the argon precursor to the hydrogen-containing precursor may be maintained at less than or about 2:1, and may be maintained at less than or about 1:1, less than or about 0.8:1, less than or about 0.7:1, less than or about 0.6:1, less than or about 0.5:1, less than or about 0.4:1, less than or about 0.3:1, less than or about 0.2:1, less than or about 0.1:1, or less.

The combination or further adjustment of processing parameters may also affect and may improve additional aspects of the produced film. Incorporating boron into hardmask films may improve selectivity to a number of films. As film stacks include greater numbers of materials, both related to hardmask opening operations as well as subsequent film etching, providing improved selectivity may further reduce the number of additional operations being performed. Increasing film crystallinity may also increase etch selectivity, however, as film crystallinity increases, conventional technologies have reduced or worsened line-edge roughness and line-width roughness. Consequently, many technologies attempt to maintain the film as amorphous silicon. The present technology may at least partially increase crystallinity of the formed film, which may increase etch selectivity, although by limiting the crystallinity, the present technology may maintain line-edge roughness and line-width roughness.

When increased hydrogen flow rate ratios according to embodiments of the present technology are utilized relative to silicon and boron precursors, crystallinity may be increased. However, by utilizing processing parameters as discussed previously, crystallinity may be maintained below or about 50 Å, and may be maintained below or about 40 Å, below or about 30 Å, below or about 20 Å, below or about 15 Å, below or about 10 Å, below or about 7 Å, below or about 5 Å, below or about 3 Å, or less, although when crystallinity is increased above or about 2 Å or higher, improved etch selectivity may be afforded.

However, as hydrogen inclusion in the plasma increases, so may hydrogen incorporation within the film. This may affect film stress as discussed previously, and may additionally impact other film characteristics. For example, hardmask films may be characterized by extinction coefficients for light at different wavelengths, which may impact lithography operations. Amorphous silicon materials may be characterized by an extinction coefficient at particular parameters of about 0.2, which may allow lithography at film thicknesses of up to about 800 nm based on lower reflectance, which may impact vision through the mask. Silicon and boron films may be characterized by increased extinction coefficients for similar parameters, although as hydrogen incorporation increases, the extinction coefficients may be at least partially reduced. For example, when boron incorporation increases, the extinction coefficient may increase to greater than or about 0.3, greater than or about 0.35, greater than or about 0.4, greater than or about 0.45, or higher.

The effect of higher extinction coefficients for light are that lithography may be challenged, and additional processing may be needed. For example, these increased extinction coefficients may limit lithography visibility to film thicknesses below or about 400 nm, below or about 300 nm, or less. However, by increasing hydrogen incorporation, utilizing increased plasma density, extinction coefficients may be reduced to below or about 0.35, and may be reduced to below or about 0.33, below or about 0.30, below or about 0.28, below or about 0.25, or less. This may allow lithography to extend to thicknesses of greater than or about 400 nm, greater than or about 450 nm, greater than or about 500 nm, or more, without performing additional alignment key opening operations. By increasing temperatures and plasma characteristics, the film structure may be formed to improve characteristics like extinction coefficient and etch selectivity, even with increased hydrogen incorporation. Hydrogen incorporation may also be increased by processing at lower temperatures, such as below 400° C., or below about 350° C., however, the film property differences of such a produced film may cause additional hydrogen outgassing in later processing as previously described. By performing processes at higher temperatures, increased thermal stability may be afforded with the films incorporating increased hydrogen formed as discussed above. Additionally, by performing deposition according to embodiments of the present technology, reduced roughness of silicon-and-boron-containing films may be afforded, which may improve hardmask effectiveness.

During subsequent etching at optional operation 630, as may be described further below, a critical dimension of the etch may be maintained more uniform with the present technology than when the present technology is not implemented. By reducing surface roughness, improved etching and structural development may be afforded.

Figure 7:
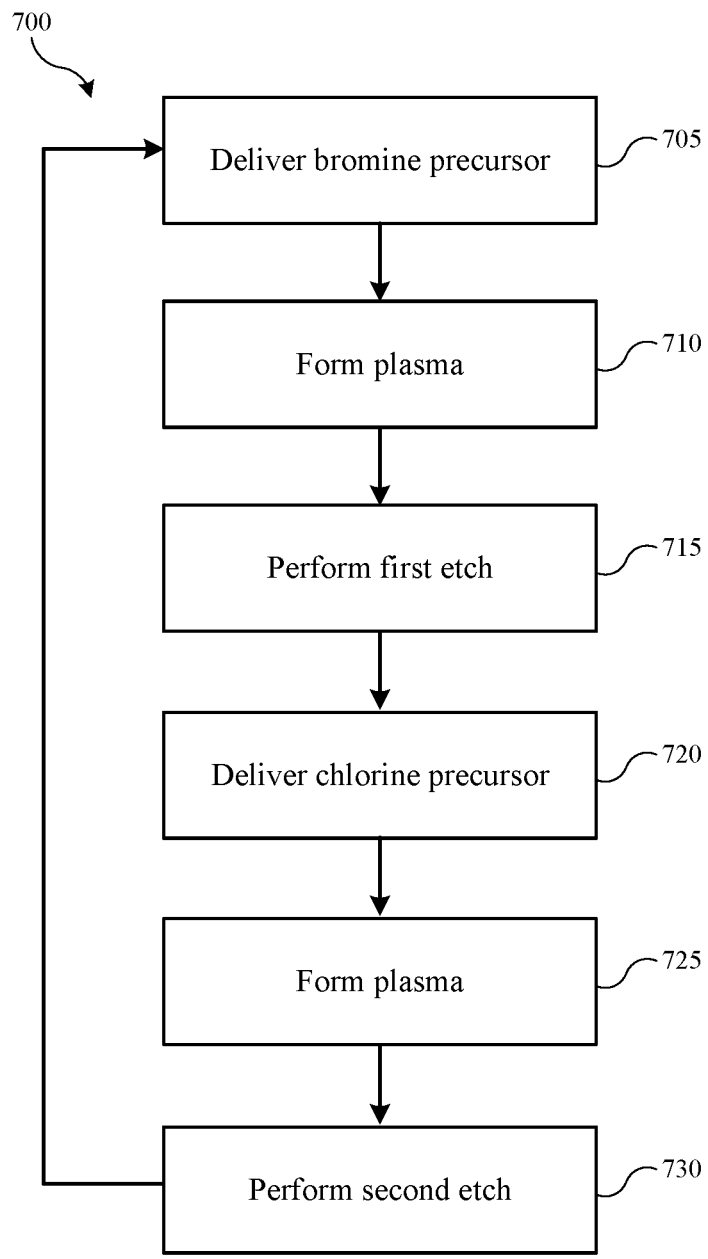
FIG. 7 shows exemplary operations that may be included in methods according to some embodiments of the present technology.

Once the silicon-and-boron material has been formed over the substrate, one or more additional operations may be performed to pattern the material. For example, an etching process may be performed to form one or more features through the silicon-and-boron-containing material. FIG. 7 shows exemplary operations of an etching method 700 that may be included in an integration method according to some embodiments of the present technology. The method may be performed in a variety of processing chambers, including processing chamber 200 described above. Method 700 may include a number of optional operations, which may or may not be specifically associated with some embodiments of methods according to the present technology. Additionally, any aspect of method 700 may be considered as optional within broader integration methods into which any number of aspects of method 700 may be incorporated. For example, many of the operations are described in order to provide a broader scope of the structural formation, but are not critical to the technology, or may be performed by alternative methodology as would be readily appreciated.

Method 700 may include additional operations prior to initiation of the listed operations. For example, additional processing operations may include forming structures on a semiconductor substrate including a boron-and-silicon-containing material, which may include both forming and removing material. Prior processing operations may be performed in the chamber in which method 700 may be performed, or processing may be performed in one or more other processing chambers prior to delivering the substrate into the semiconductor processing chamber in which method 700 may be performed. Regardless, method 700 may optionally include delivering a semiconductor substrate to a processing region of a semiconductor processing chamber, such as processing chamber 200 described above, or other chambers that may include components as described above. The substrate may be deposited on a substrate support, which may be a chuck, such as electrostatic chuck 222, and which may reside in a processing region of the chamber, such as processing region 201 described above.

The substrate may be any number of materials on which materials may be deposited, such as described above, and may include a boron-and-silicon-containing material, such as may be deposited by one or more operations of method 600 described above. In some embodiments, one or more additional operations may be performed prior to initiation of method 700. For example, an additional masking material may be deposited or formed overlying the boron-and-silicon-containing material to initiate a pattern transfer. For example, an oxide or other mask layer may be formed over the boron-and-silicon-containing material as described above. Photolithography or other patterning may be performed to produce a pattern through the mask to the level of the boron-and-silicon-containing material.

Method 700 may include one or more operations for etching through the boron-and-silicon-containing material. A bromine-containing precursor may be delivered to the processing region at operation 705. A plasma may be formed of the precursor at operation 710, and the plasma effluents may etch through the boron-and-silicon-containing material at operation 715. The bromine precursor may be any bromine-containing material, and in some embodiments may be or include hydrogen bromide. Radical bromine materials may interact to provide a clean and straight etch profile through the boron-and-silicon-containing material. Additionally, the bromine radicals may maintain a flat etch-front profile within the material. However, the etch rate may be relatively slower than other etchant precursors. Consequently, in some embodiments method 700 may include additional operations utilizing one or more additional precursors. For example, after a first amount of material is etched utilizing a bromine-containing precursor, a second etch process may be performed.

For example, after an amount of etch utilizing bromine, the chamber may be purged, or the flow of bromine may be halted. At operation 720, a chlorine-containing precursor may be delivered to the processing region, such as diatomic chlorine or any other chlorine-containing precursor previously described. A plasma may be formed of the precursor at operation 725, and a second etch at operation 730 may be performed with radical chlorine species. Radical chlorine may etch at a faster rate than bromine, although chlorine may produce a pinched taper at the etch front, which can affect critical dimension through the material. The method may be repeated, or operations may be repeated, to alternate the two etch processes, which may be characterized by a higher etch rate based on the chlorine etch operations, while maintaining a flatter etch front based on the bromine etch operations. The processes may be looped any number of times depending on the thickness of the boron-and-silicon-containing material, and may be looped greater than or about 2 times, greater than or about 10 times, greater than or about 25 times, greater than or about 50 times, greater than or about 100 times, greater than or about 200 times, or more. The more times the loop is performed, the cleaner the pattern may be produced through the material, although more loops may increase a time for the method to be performed. In some embodiments, the etching method may begin and end with a bromine portion of the etch process, which may ensure a bottom structural critical dimension is better maintained.

In some embodiments, by performing a looping process as described, critical dimensions of patterns, such as apertures, may be maintained more uniform both from a top-to-bottom perspective, as well as across the substrate. For example, in some embodiments, a critical dimension at the top of features or at the bottom of features may be maintained across the substrate between a center region and an edge region, and a diameter of apertures formed at an edge region may be at least about 80% a diameter of apertures formed at a center of the substrate, and may be at least about 85% a diameter of apertures formed at a center of the substrate, at least about 90% a diameter of apertures formed at a center of the substrate, at least about 95% a diameter of apertures formed at a center of the substrate, at least about 98% a diameter of apertures formed at a center of the substrate, or more.

Figure 8:
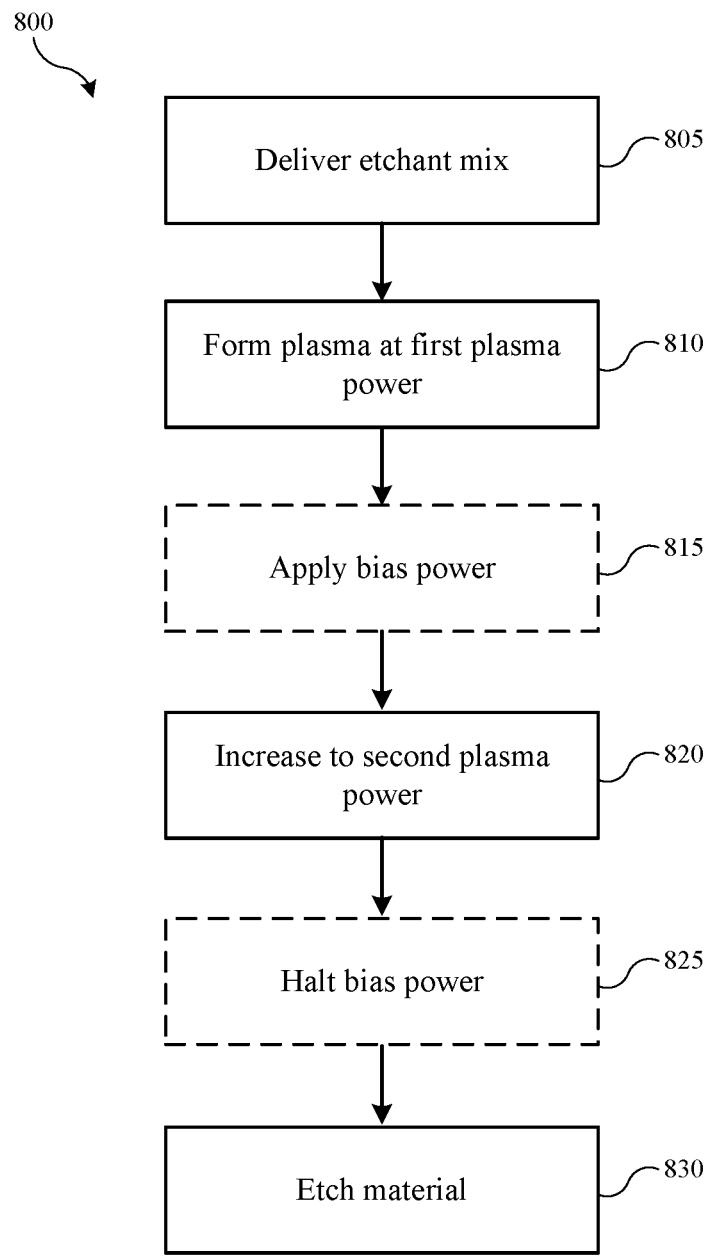
FIG. 8 shows exemplary operations that may be included in methods according to some embodiments of the present technology.

Looping processes may necessarily increase etching time of the process by adding time during precursor switching operations. Accordingly, some embodiments the present technology may also utilize a continuous process with a single etchant mixture in some embodiments of the present technology. FIG. 8 shows exemplary operations of an etching method 800 that may be included in an integration method according to some embodiments of the present technology. The method may be performed in a variety of processing chambers, including processing chamber 200 described above. Method 800 may include a number of optional operations, which may or may not be specifically associated with some embodiments of methods according to the present technology. Additionally, any aspect of method 800 may be considered as optional within broader integration methods into which any number of aspects of method 800 may be incorporated. For example, many of the operations are described in order to provide a broader scope of the structural formation, but are not critical to the technology, or may be performed by alternative methodology as would be readily appreciated.

Method 800 may include additional operations prior to initiation of the listed operations. For example, similarly as described above for method 700, additional processing operations may include forming structures on a semiconductor substrate including a boron-and-silicon-containing material, which may include both forming and removing material. Prior processing operations may be performed in the chamber in which method 800 may be performed, or processing may be performed in one or more other processing chambers prior to delivering the substrate into the semiconductor processing chamber in which method 800 may be performed. Regardless, method 800 may optionally include delivering a semiconductor substrate to a processing region of a semiconductor processing chamber, such as processing chamber 200 described above, or other chambers that may include components as described above. The substrate may be deposited on a substrate support, which may be a chuck, such as electrostatic chuck 222, and which may reside in a processing region of the chamber, such as processing region 201 described above. The substrate may include any of the materials as previously described, including a boron-and-silicon-containing material, as well as an overlying mask structure that may have been previously patterned.

Method 800 may include providing an etchant mixture into a processing region of the processing chamber at operation 805. The etchant mixture may include one or more precursors that may perform together to protect sidewall features during etching operations. In some embodiments the etchant mixture may include a chlorine-containing precursor and an oxygen-containing precursor. The chlorine-containing precursor may include diatomic chlorine as well as any other chlorine-containing precursor described above. Oxygen-containing precursors used in any operation as described throughout the present technology may include $O_2$, $N_2O$, $NO_2$, $O_3$, $H_2O$, as well as any other oxygen-containing precursors. In some embodiments the etchant mixture may also include a fluorine-containing precursor, which can be or include any precursor described elsewhere in the present disclosure.

At operation 810 a plasma may be formed of the etchant mixture, as well as any carrier or inert precursors delivered as well. The plasma may be formed with a first plasma power, and a bias power may be applied at optional operation 815, during application of the plasma power. Plasma generation may be formed from a plasma source as previously described, and may be formed at a first plasma power, which may dissociate the etchant precursors to produce plasma effluents. The bias power may draw the plasma effluents to the structure and produce an anisotropic etch profile, which may maintain the pattern through the structure. The etch may be performed for a period of time that may correspond to a duty cycle of the bias power as will be described further below. At the end of the first period of time, the first plasma power may be increased to a second plasma power at operation 820. The precursors may be continuously flowed during the change in plasma power. In some embodiments the bias power may be halted during the second period of time at optional operation 825. Again, the second period of time may be the remaining portion of the duty cycle applied to the bias power, and the first period of time and the second period of time may correspond to a period of pulse frequency applied to the plasma powers.

Over time and consecutive periods of the process, the plasma effluents may contact the boron-and-silicon-containing material, and the boron-and-silicon-containing material may be etched at operation 830, which may transfer the pattern into the material as previously described.

As explained previously the bias applied may draw etchants into the substrate and produce a more anisotropic etch process. Because of the reactivity of the etchant materials, the plasma effluents may also remove other exposed materials, such as oxide on sidewalls of the overlying materials. This may increase critical dimensions of the features, which may lose control of uniformity of the process. By incorporating the oxygen-containing precursor, a re-deposition of removed oxide materials may be facilitated during the process, and may be used to passivate exposed surfaces to maintain critical dimensions. However, the etchant may be more reactive than the passivation process, which may continue to erode critical dimensions. Accordingly, the present etch process may be performed with a level-to-level plasma generation as noted above, which may facilitate passivation while controlling the etch process.

When the bias power is halted, the etch front may be slowed from continued chlorine etch. Additionally, by increasing the source plasma power, plasma density may be increased, and additional generation of oxygen radicals may be produced, which may increase the passivation. Similarly, by halting the bias power, an isotropic interaction may occur with the sidewalls of the structure to be protected. Consequently, additional passivation may be performed. By controlling a delivery rate of the constituent precursors, the process can be performed continuously while providing both the etching and passivating during the constituent time periods of the pulsing frequency. In some embodiments, a pulsing frequency applied to one or both power sources may be a frequency of greater than or about 100 Hz, and may be greater than or about 250 Hz, greater than or about 500 Hz, greater than or about 1,000 Hz, greater than or about 2,000 Hz, or more.

While the source power may be maintained continuously during the pulsing frequency, a duty cycle may be applied to the bias power, which may control the etch. For example, while the first plasma power may be increased after a set time related to the duty cycle of the bias power, the bias power may be switched off according to the duty cycle. As one non-limiting example, the source power may be applied at a first plasma power at time T0, and the bias power may be applied at a first power at time T0. This may cause an etch to increase until the duty cycle switches off the bias power at time T1. Simultaneously with the bias power being switched off, the first plasma power may be switched from the first power to the second power at time T1. This may occur until a time T2, which may correspond to the next T0 of the next period of the pulsing at any of the frequencies as described above. Accordingly, the time between time T0 and time T2 may be one period at the pulsing frequency, and time T1 may be the duty cycle application at the corresponding pulsing frequency.

The bias power may be applied at any power, and may be applied at less than or about 2,000 W, and may be applied at less than or about 1,500 W, less than or about 1,400 W, less than or about 1,300 W, less than or about 1,200 W, less than or about 1,100 W, less than or about 1,000 W, less than or about 900 W, less than or about 800 W, or less. The duty cycle may be less than or about 50%, and in some embodiments may be less than or about 45%, less than or about 40%, less than or about 35%, less than or about 30%, less than or about 25%, less than or about 20%, less than or about 15%, or less. Plasma power for the source may be different for the first period of time and the second period of time. For example, at the first period of time, the plasma source power may be greater than or about 1,000 W, and may be greater than or about 1,100 W, greater than or about 1,200 W, greater than or about 1,300 W, greater than or about 1,400 W, greater than or about 1,500 W, or more. In some embodiments, the source power and the bias power during the first period of time may be the same. At the second period of time the source power may be increased to a second power that may be greater than or about 2,000 W, and may be greater than or about 2,200 W, greater than or about 2,400 W, greater than or about 2,600 W, greater than or about 2,800 W, greater than or about 3,000 W, or more. The process may then proceed continuously until the etch has completed.

In some embodiments the substrate may be maintained at a temperature of greater than or about 200° C., and may be maintained during the method at a temperature of greater than or about 225° C., greater than or about 250° C., greater than or about 275° C., greater than or about 300° C., or more. By maintaining the temperature higher, volatile byproducts may be more readily removed as volatiles, and may become gases more readily. Critical dimensions may be affected by the particular structure being formed, but in some embodiments, apertures being formed may be characterized by a diameter of less than or about 50 nm, and may be characterized by a diameter of less than or about 40 nm, less than or about 30 nm, less than or about 20 nm, less than or about 10 nm, or less. Because of the rate of etching that may be performed, increased byproducts may be produced in some embodiments. By including the fluorine-containing precursor, clogging of the mask may be reduced as the additional etchant may further break down the byproduct materials, which may more readily flow from the pattern being produced. Additionally, pressure within the processing chamber may be maintained below or about 500 mTorr, and may be maintained below or about 100 mTorr, below or about 50 mTorr, below or about 20 mTorr, or less.

The etchant precursors may be provided in a ratio in some embodiments of the present technology. For example the mixture may include a first amount of a fluorine-containing precursor, a second amount of an oxygen-containing precursor, and a third amount of the chlorine-containing precursor. In some embodiments the oxygen-containing precursor may be provided at a flow rate that is greater than or about twice the flow rate of the fluorine-containing precursor, and may be greater than or about three times the flow rate, greater than or about four times the flow rate, greater than or about five times the flow rate, greater than or about six times the flow rate, greater than or about seven times the flow rate, greater than or about eight times the flow rate, greater than or about nine times the flow rate, greater than or about ten times the flow rate, or more. For example, in some embodiments the oxygen-containing precursor may be flowed at a rate of greater than or about 25 sccm, and may be flowed at a rate of greater than or about 50 sccm, greater than or about 75 sccm, greater than or about 100 sccm, or more. The chlorine-containing precursor may be provided at a flow rate that is greater than or about twice the flow rate of the oxygen-containing precursor, and may be greater than or about four times the flow rate, greater than or about six times the flow rate, greater than or about eight times the flow rate, greater than or about ten times the flow rate, greater than or about twelve times the flow rate, greater than or about fourteen times the flow rate, greater than or about sixteen times the flow rate, greater than or about twenty times the flow rate, or more. For example, in some embodiments the oxygen-containing precursor may be flowed at a rate of greater than or about 250 sccm, and may be flowed at a rate of greater than or about 500 sccm, greater than or about 750 sccm, greater than or about 1,000 sccm, or more.

Figure 9:
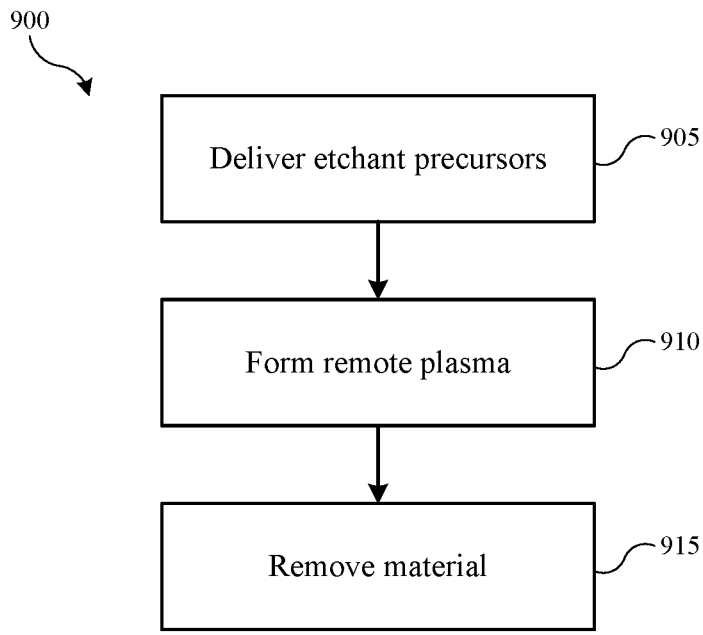
FIG. 9 shows exemplary operations that may be included in methods according to some embodiments of the present technology.

After the pattern transfer has been completed, the boron-and-silicon-containing material may be removed from the substrate. FIG. 9 shows exemplary operations of a removal method 900 that may be included in an integration method according to some embodiments of the present technology. The method may be performed in a variety of processing chambers, including processing chamber 300 described above. Method 900 may include a number of optional operations, which may or may not be specifically associated with some embodiments of methods according to the present technology. Additionally, any aspect of method 900 may be considered as optional within broader integration methods into which any number of aspects of method 900 may be incorporated. For example, many of the operations are described in order to provide a broader scope of the structural formation, but are not critical to the technology, or may be performed by alternative methodology as would be readily appreciated. Method 900 may describe operations shown schematically in FIGS. 10A-10B, the illustrations of which will be described in conjunction with the operations of method 900. It is to be understood that the figures illustrate only partial schematic views, and a substrate may contain any number of additional materials and features having a variety of characteristics and aspects as illustrated in the figures.

Method 900 may include additional operations prior to initiation of the listed operations. For example, additional processing operations may include additional removal operations or processing through the boron-and-silicon-containing material, which may include both forming and removing material. Prior processing operations may be performed in the chamber in which method 900 may be performed, or processing may be performed in one or more other processing chambers prior to delivering the substrate into the semiconductor processing chamber in which method 900 may be performed. Regardless, method 900 may optionally include delivering a semiconductor substrate to a processing region of a semiconductor processing chamber, such as processing chamber 300 described above, or other chambers that may include components as described above. The substrate may be deposited on a substrate support, which may be a chuck, such as pedestal 303, and which may reside in a processing region 304 of the chamber as described above.

Figures 10A, 10B:
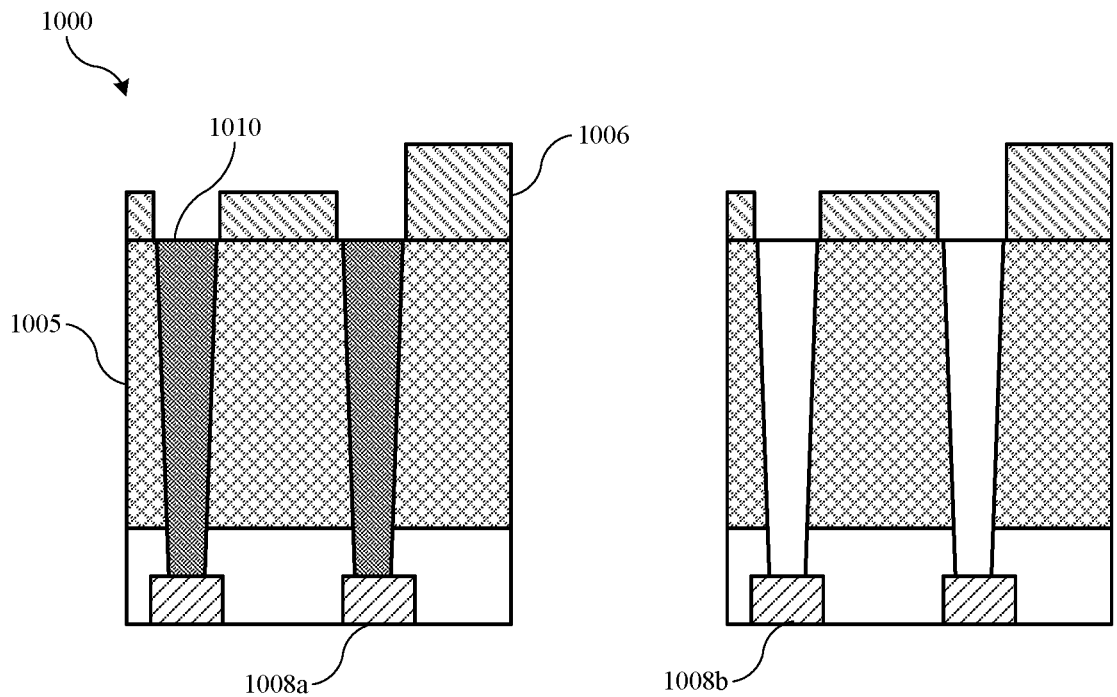
FIGS. 10A-10B show schematic cross-sectional partial views of a substrate during a removal process according to some embodiments of the present technology.

A substrate on which several operations have been performed may be substrate 1005 or structure 1000, which may show one or more underlying structures. It is to be understood that structure 1000 may not show all layers, materials, or structures that may be formed beneath the materials shown. For example, the substrate 1005 may show materials through which one or more features may be formed, and may show additional masking or structural layers. Substrate 1005 may illustrate a boron-and-silicon-containing material 1006 that is to be removed after patterning. FIG. 10A illustrates a first structure that may be provided, and FIG. 10B illustrates a second structure that may be processed. In structures such as those illustrated in FIG. 10A, the patterning may expose a contact structure 1008a, and the trenches, apertures, or features may be filled with a protective material 1010 as illustrated. In structures such as those illustrated in FIG. 10B, the patterning may maintain contact structure 1008b exposed during the removal operation.

At operation 905, one or more etchant precursors may be delivered to the processing chamber, such as into a remote plasma region 327 as previously described. A plasma may be formed in this region at operation 910, which may be flowed into a processing region to contact the boron-and-silicon-containing material at operation 915, which may remove it from other exposed structures. As illustrated in the figures, one or more materials may be exposed during the etch process, although etching of these exposed materials may be minimized. However, the boron-and-silicon-containing material may be formed in a way that extends exposure to the materials in some embodiments. For example, in some embodiments as illustrated, edge regions that may not be patterned may be characterized by a greater thickness of mask material than central regions. Consequently, removal processes may still be removing material at edge regions, while central patterned materials may be fully exposed. Accordingly, in some embodiments the removal process may be tuned to ensure etch selectivity to each exposed material remains sufficiently high to limit damage to the structures, as well as to increase etch rates to limit time required to remove material from the substrate.

Precursors used in the present technology may include a fluorine-containing precursor as well as additional precursors as will be described below. An exemplary fluorine-containing precursor may be nitrogen trifluoride, which may be flowed into the remote plasma region, which may be separate from, but fluidly coupled with, the processing region. Other sources of fluorine may be used in conjunction with or as replacements for the nitrogen trifluoride. In general, a fluorine-containing precursor may be flowed into the remote plasma region and the fluorine-containing precursor may include at least one precursor selected from the group of atomic fluorine, diatomic fluorine, nitrogen trifluoride, carbon tetrafluoride, hydrogen fluoride, xenon difluoride, a fluoronated organic molecule or hydrocarbon, such as fluoromethane or difluoromethane, and various other fluorine-containing precursors used or useful in semiconductor processing.

Additional precursors may also be delivered with the fluorine-containing precursor in some embodiments of the present technology. For example, a hydrogen-containing precursor may be delivered, or one or more other precursors may be delivered, such as argon, nitrogen, helium, or other precursors. Hydrogen may be readily ionizable, which may facilitate processing in some embodiments and increase ion density within the processing region to increase etchant production. The hydrogen-containing precursor may be or include hydrogen, a hydrocarbon, or any hydrogen-containing precursor.

Pressure and temperature may affect the process and etch rate. Pressure within the processing chamber may be maintained below or about 20 Torr, and may be maintained below or about 10 Torr, below or about 5 Torr, below or about 1 Torr, or less. The temperature of the substrate support may be maintained at a temperature that is greater than or about 100° C., which may increase removal rates in some embodiments, and the temperature may be maintained greater than or about 150° C., greater than or about 175° C., greater than or about 200° C., greater than or about 225° C., greater than or about 250° C., or higher. Plasma power may similarly impact etch rates, and in some embodiments removal operations may be performed at a capacitively-coupled plasma power of greater than or about 2.0 kW, and may be performed at a plasma power of greater than or about 2.5 kW, greater than or about 3.0 kW, greater than or about 3.5 kW, greater than or about 4.0 kW, or higher.

The materials that may be exposed during the removal may include a number of materials, including metals for the contact landing, such as tungsten for example, and may include a number of dielectric materials including silicon oxide, silicon nitride, and silicon carbon nitride. Additionally, in some embodiments, such as those illustrated in FIG. 10A, the material delivered into the trenches, apertures, or features, may be or include titanium nitride, for example, or some other transition metal nitride. To limit etching of the transition metal nitride, an additional precursor may be delivered with the etchant precursor, such as a nitrogen-containing precursor. The nitrogen containing precursor may include ammonia, or any other nitrogen-containing material, which may suppress etching of the transition metal nitride, while performing removal of the boron-and-silicon-containing material with the other etchant materials.

By performing the processes as described above, an etch selectivity of boron and boron-and-silicon materials relative to silicon oxide, silicon nitride, silicon carbon nitride, and tungsten or other metals may be maintained at greater than or about 100:1, and may produce selectivity of greater than or about 200:1, greater than or about 400:1, greater than or about 600:1, greater than or about 800:1, greater than or about 1,000:1, or higher. In some embodiments one or more of these materials may remain substantially unetched during removal of the boron or boron-and-silicon-containing material. Additionally, an etch selectivity of boron and boron-and-silicon materials relative to titanium nitride or a transition metal nitride may be maintained at greater than or about 20:1, and may produce selectivity of greater than or about 40:1, greater than or about 80:1, greater than or about 100:1, greater than or about 150:1, greater than or about 200:1, or higher.

Producing plasma effluents in a remote plasma region may allow ions to be filtered from the plasma effluents while being flowed through the electrode as described above. This may increase etch rates by reducing a bombardment component of the etch. Additionally, utilizing a remote plasma region of a chamber instead of a remote plasma source unit external to the chamber may limit recombination and complete ionization of constituent etchant materials. Performing a high-plasma power etch may allow the boron-and-silicon-containing materials to be removed at an etch rate greater than or about 30 nm/min, and may provide etch rates greater than or about 35 nm/min, greater than or about 40 nm/min, greater than or about 45 nm/min, greater than or about 50 nm/min, greater than or about 55 nm/min, greater than or about 60 nm/min, greater than or about 65 nm/min, greater than or about 70 nm/min, greater than or about 75 nm/min, greater than or about 80 nm/min, or higher. This may limit interaction with other exposed materials, and reduce overall removal time during processing to improve throughput. By performing processes according to some embodiments of the present technology, integration of processes may reduce throughput and produce higher quality devices over conventional technology.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A processing method comprising:
   depositing a silicon-and-boron-containing material on a substrate disposed within a processing region of a semiconductor processing chamber;
   etching portions of the silicon-and-boron-containing material with a chlorine-containing precursor to form one or more features in the substrate; and
   removing remaining portions of the silicon-and-boron-containing material from the substrate with a fluorine-containing precursor at a rate of greater than 70 nm/min.

2. The processing method of claim 1, wherein depositing the silicon-and-boron-containing material comprises:
   delivering a silicon-containing precursor and a boron-containing precursor to a processing region of a semiconductor processing chamber;
   providing a hydrogen-containing precursor with the silicon-containing precursor and the boron-containing precursor, wherein a flow rate ratio of the hydrogen-containing precursor to either of the silicon-containing precursor or the boron-containing precursor is greater than or about 2:1; and
   forming a plasma of all precursors within the processing region of a semiconductor processing chamber.

3. The processing method of claim 1, wherein the silicon-and-boron-containing material is characterized by a film thickness greater than or about 20 nm.

4. The processing method of claim 1, wherein a substrate temperature is maintained above or about 400° C. during the depositing the silicon-and-boron-containing material on the substrate, and wherein the substrate temperature is maintained above or about 200° C. during the removing.

5. The processing method of claim 1, wherein the etching comprises:
   forming a plasma of a bromine-containing precursor;
   contacting the silicon-and-boron-containing material with plasma effluents of the bromine-containing precursor;
   halting delivery of the bromine-containing precursor;
   forming a plasma of a chlorine-containing precursor; and
   contacting the silicon-and-boron-containing material with plasma effluents of the chlorine-containing precursor.

6. The processing method of claim 1, wherein the etching comprises:
   forming a plasma of an etchant mixture comprising the chlorine-containing precursor and an oxygen-containing precursor;
   contacting the silicon-and-boron-containing material with plasma effluents of the etchant mixture while forming the plasma at a first plasma power; and
   subsequent a first period of time, increasing the first plasma power to a second plasma power.

7. The processing method of claim 6, wherein the etching comprises:
   transferring a pattern from an overlying mask material through the silicon-and-boron-containing material.

8. The processing method of claim 6, wherein the etching comprises:
   applying a bias power during the first period of time; and
   halting the bias power subsequent the first period of time.

9. The processing method of claim 1, wherein the removing comprises:
   forming a remote plasma of an etchant mixture comprising the fluorine-containing precursor and a hydrogen-containing precursor;
   contacting the silicon-and-boron-containing material with plasma effluents of the etchant mixture; and
   removing the silicon-and-boron-containing material at a selectivity of greater than or about 20:1 relative to another exposed material on the substrate.

10. The processing method of claim 9, wherein the remote plasma is formed at a plasma power of greater than or about 2.0 kW.

11. An etching method comprising:
    forming a plasma of an etchant mixture comprising a chlorine-containing precursor and an oxygen-containing precursor;
    contacting a silicon-and-boron-containing material on a substrate disposed within a processing region of a semiconductor processing chamber with plasma effluents of the etchant mixture while forming the plasma at a first plasma power, and
    subsequent a first period of time, increasing the first plasma power to a second plasma power to form one or more features in the substrate.

12. The etching method of claim 11, wherein the silicon-and-boron-containing material is characterized by a boron concentration of greater than or about 40 at. %.

13. The etching method of claim 11, wherein the etchant mixture further comprises:
    a fluorine-containing precursor, wherein a flow-rate ratio of the fluorine-containing precursor to the oxygen-containing precursor to the chlorine-containing precursor is greater than or about 1:5:10.

14. The etching method of claim 11, further comprising:
    applying a bias power during the first period of time; and
    halting the bias power subsequent the first period of time.

15. The etching method of claim 14, wherein the plasma is formed at a pulsing frequency of greater than or about 500 Hz.

16. The etching method of claim 15, wherein a duty cycle of the bias power during the plasma formation is less than or about 40%.

17. A removal method comprising:
forming a remote plasma of an etchant mixture comprising a fluorine-containing precursor and a hydrogen-containing precursor;
contacting a silicon-and-boron-containing material characterized by a boron concentration of greater than or about 10 at. % on a substrate disposed within a processing region of a semiconductor processing chamber with plasma effluents of the etchant mixture, wherein the silicon-and-boron-containing material defines one or more features in the substrate; and
removing the silicon-and-boron-containing material at a rate of greater than or about 35 nm/min.

18. The removal method of claim 17, wherein a temperature of the substrate during the removing is maintained above or about 200° C., and wherein the remote plasma is formed at a plasma power of greater than or about 2.0 kW.

19. The removal method of claim 17, wherein the substrate further comprises an exposed region of titanium nitride, and wherein the etchant mixture further includes ammonia.

20. The etching method of claim 11, further comprising:
passivating exposed surfaces of the one or more features in the substrate.

* * * * *